(12) United States Patent
Muraoka et al.

(10) Patent No.: US 8,345,465 B2
(45) Date of Patent: Jan. 1, 2013

(54) DRIVING METHOD OF VARIABLE RESISTANCE ELEMENT, INITIALIZATION METHOD OF VARIABLE RESISTANCE ELEMENT, AND NONVOLATILE STORAGE DEVICE

(75) Inventors: Shunsaku Muraoka, Osaka (JP); Takeshi Takagi, Kyoto (JP); Satoru Mitani, Osaka (JP); Koji Katayama, Nara (JP)

(73) Assignee: Panasonic Corporation, Osaka (JP)

( * ) Notice: Subject to any disclaimer, the term of this patent is extended or adjusted under 35 U.S.C. 154(b) by 281 days.

(21) Appl. No.: 12/745,300

(22) PCT Filed: Sep. 30, 2009

(86) PCT No.: PCT/JP2009/005017
§ 371 (c)(1),
(2), (4) Date: May 28, 2010

(87) PCT Pub. No.: WO2010/038442
PCT Pub. Date: Apr. 8, 2010

(65) Prior Publication Data
US 2010/0271860 A1    Oct. 28, 2010

(30) Foreign Application Priority Data

Sep. 30, 2008   (JP) .................................. 2008-253107

(51) Int. Cl.
*G11C 11/00* (2006.01)
(52) U.S. Cl. .......................... 365/148; 257/43; 438/104
(58) Field of Classification Search .................. 365/148; 257/143; 438/104
See application file for complete search history.

(56) References Cited

U.S. PATENT DOCUMENTS

| 6,204,139 B1 | 3/2001 | Liu et al. |
| 6,930,909 B2 * | 8/2005 | Moore et al. .................. 365/148 |
| 6,995,999 B2 | 2/2006 | Morimoto |

(Continued)

FOREIGN PATENT DOCUMENTS

JP    2004-363604    12/2004

(Continued)

OTHER PUBLICATIONS

International Search Report issued Dec. 8, 2009 in International (PCT) Application No. PCT/JP2009/005017.

(Continued)

*Primary Examiner* — Hoai V Ho
*Assistant Examiner* — Jay Radke
(74) *Attorney, Agent, or Firm* — Wenderoth, Lind & Ponack, L.L.P.

(57) ABSTRACT

A method of driving a variable resistance element includes: a writing step performed by applying a writing voltage pulse having a first polarity to a variable resistance layer to change a resistance state of the layer from high to low; and an erasing step performed by applying an erasing voltage pulse having a second polarity to the layer to change the state from low to high. Here, $|Vw1|>|Vw2|$ where Vw1 represents a voltage value of the writing voltage pulse for first to N-th writing steps ($N \geq 1$) and Vw2 represents a voltage value of the writing voltage pulse for (N+1)-th and subsequent writing steps, and $|Ve1|>|Ve2|$ where Ve1 represents a voltage value of the erasing voltage pulse for first to M-th erasing steps ($M \geq 1$) and Ve2 represents a voltage value of the erasing voltage pulse for (M+1)-th and subsequent erasing steps. The (N+1)-th writing step follows the M-th erasing step.

14 Claims, 15 Drawing Sheets

U.S. PATENT DOCUMENTS

| | | | |
|---|---|---|---|
| 7,233,520 B2* | 6/2007 | Daley | 365/163 |
| 7,433,222 B2* | 10/2008 | Hosoi et al. | 365/148 |
| 7,663,132 B2* | 2/2010 | Toda et al. | 257/3 |
| 7,960,775 B2* | 6/2011 | Courtade et al. | 257/312 |
| 8,054,674 B2* | 11/2011 | Tamai et al. | 365/148 |
| 8,125,818 B2* | 2/2012 | Muraoka et al. | 365/148 |
| 8,279,658 B2* | 10/2012 | Muraoka et al. | 365/148 |
| 2004/0245557 A1 | 12/2004 | Seo et al. | |
| 2004/0264244 A1 | 12/2004 | Morimoto | |
| 2007/0114587 A1 | 5/2007 | Seo et al. | |
| 2007/0159867 A1* | 7/2007 | Muraoka et al. | 365/100 |
| 2008/0002455 A1* | 1/2008 | Toda et al. | 365/148 |
| 2008/0048165 A1 | 2/2008 | Miyazawa | |
| 2008/0111245 A1 | 5/2008 | Osano et al. | |
| 2008/0219039 A1* | 9/2008 | Kumar et al. | 365/148 |
| 2008/0220601 A1* | 9/2008 | Kumar et al. | 438/585 |
| 2008/0278990 A1* | 11/2008 | Kumar et al. | 365/148 |
| 2009/0046496 A1* | 2/2009 | Katoh | 365/148 |
| 2009/0147558 A1* | 6/2009 | Tamai et al. | 365/148 |
| 2009/0152526 A1* | 6/2009 | Courtade et al. | 257/4 |
| 2009/0283736 A1 | 11/2009 | Kanzawa et al. | |
| 2009/0290407 A1* | 11/2009 | Mouli | 365/158 |
| 2010/0073983 A1* | 3/2010 | Hosoi | 365/51 |
| 2010/0090193 A1 | 4/2010 | Mikawa et al. | |
| 2010/0172170 A1* | 7/2010 | Tamai et al. | 365/148 |
| 2011/0002158 A1* | 1/2011 | Muraoka et al. | 365/148 |
| 2011/0080770 A1* | 4/2011 | Muraoka et al. | 365/148 |
| 2011/0110144 A1* | 5/2011 | Kawai et al. | 365/148 |
| 2011/0128773 A1* | 6/2011 | Azuma et al. | 365/148 |
| 2011/0194336 A1* | 8/2011 | Mouli | 365/158 |
| 2011/0216575 A1* | 9/2011 | Yamaguchi et al. | 365/148 |
| 2011/0299322 A1* | 12/2011 | Iijima et al. | 365/148 |

FOREIGN PATENT DOCUMENTS

| | | |
|---|---|---|
| JP | 2005-25914 | 1/2005 |
| JP | 2007-4849 | 1/2007 |
| JP | 2007-4873 | 1/2007 |
| JP | 2007-173515 | 7/2007 |
| JP | 2007-188559 | 7/2007 |
| JP | 2008-28228 | 2/2008 |
| JP | 2008-306157 | 12/2008 |
| JP | 2010-21381 | 1/2010 |
| WO | 2008/047711 | 4/2008 |
| WO | 2008/149484 | 12/2008 |
| WO | 2009/050833 | 4/2009 |
| WO | 2010/004705 | 1/2010 |

OTHER PUBLICATIONS

A. Odagawa et al., *"Electroforming and resistance-switching mechanism in a magnetite thin film"*, Applied Physics Letters 91, 2007.

S. Muraoka et al., *"Fast switching and long retention Fe-O ReRAM and its switching mechanism"*, Electron Devices Meeting, 2007, IEDM 2007, IEEE International Dec. 10-12, 2007 (pp. 779-782).

Z. Wei et al., *"Improvement of ReRAM retention properties in Pt/FeOx/Pt heterostructures by combining unipolar and bipolar switching modes"*, MRS 2008 Spring meeting.

Z. Wei et al. *"Highly Reliable TaOx ReRAM and Direct Evidence of Redox Reaction Mechanism"*, Electron Devices Meeting, 2008, IEDM 2008. IEEE International Dec. 15-17, 2008 (pp. 293-296).

\* cited by examiner (※) {
Second Writing Step
$(Vw2=-2.0V / 100ns, |Vw1| > |Vw2|)$
Second Erasing Step
$(Ve2=+2.5V / 100ns, |Ve1| > |Ve2|)$
}

Composition of First Tantalum Oxide Layer 3a    TaOx (x=1.54)
Composition of Second Tantalum Oxide Layer 3b    TaOy (y=2.47)
Thickness of Variable Resistance Layer 3    30nm
Thickness of First Tantalum Oxide Layer 3a    22nm
Thickness of Second Tantalum Oxide Layer 3b    8nm Composition of First Tantalum Oxide Layer 3a    TaOx (x=1.54)
Composition of Second Tantalum Oxide Layer 3b  TaOy (y=2.47)
Thickness of Variable Resistance Layer 3        50nm
Thickness of First Tantalum Oxide Layer 3a      45nm
Thickness of Second Tantalum Oxide Layer 3b   5nm First Writing Voltage Vw1 = Second Writing Voltage Vw2
= −2.0V/100ns First Erasing Voltage Ve1 = Second Erasing Voltage Ve2
= +2.5V/100ns First Writing Voltage Vw1 = Second Writing Voltage Vw2
= −3.0V/100ns First Erasing Voltage Ve1 = Second Erasing Voltage Ve2
= +4.0V/100ns

DRIVING METHOD OF VARIABLE RESISTANCE ELEMENT, INITIALIZATION METHOD OF VARIABLE RESISTANCE ELEMENT, AND NONVOLATILE STORAGE DEVICE

TECHNICAL FIELD

The present invention relates to a method of driving a variable resistance element having resistance values that vary depending on applied electric pulses, an initialization method of the above variable resistance element, and a nonvolatile storage device that performs the methods.

BACKGROUND ART

In recent years, with the development of digital technologies regarding electronic devices, in order to store data such as images, requirements arise for a larger capacity of nonvolatile variable resistance elements, reduction of power consumption for writing, a higher speed for a writing/reading time, a longer duration, and the like. It is considered that current attempt at more microfabricated flash memories using floating gates has a limit to satisfy such requirements.

One conventional technology, which is hereinafter, referred to as "conventional technology 1", having a possibility of satisfying the requirements is disclosed to provide a nonvolatile variable resistance element made of a perovskite material (for example, $Pr_{(1-x)}Ca_xMnO_3$[PCMO], $LaSrMnO_3$ [LSMO], $GdBaCo_xO_y$[GBCO], and the like) (refer to Patent Reference 1). In this technology, the perovskite material is applied with electric pulses (voltages having waveforms with short durations) having different polarities in order to increase or decrease a resistance value of the material, which enables the nonvolatile variable resistance element to store data in association with the varying resistance value.

There is another conventional technology, which is hereinafter, referred to as "conventional technology 2", for switching a resistance value by using electric pulses having the same polarity. In the technology, a nonvolatile variable resistance element exploits the characteristics that a resistance value of a film made of transition metal oxide (NiO, $V_2O$, ZnO, $Nb_2O_5$, $TiO_2$, $WO_3$, or CoO) is varied when electric pulses having different pulse widths are applied to the film (refer to Patent Reference 2). There is also a variable resistance element made of a transition metal oxide film which has a structure including a cross-point type memory array using a diode.

PRIOR ARTS

Patent Reference

[Patent Reference 1] U.S. Pat. No. 6,204,139
[Patent Reference 2] Japanese Unexamined Patent Application Publication No. 2004-363604

DISCLOSURE OF INVENTION

Problems that Invention is to Solve

However, it is known that conventional technology 1 has a problem of insufficiency in operation stability and reproducibility. In addition, since crystallization of an oxide crystal having a perovskite structure such as $(Pr_{0.7}Ca_{0.3}MnO_3)$ needs a high temperature generally from 650 degrees to 850 degrees, the crystallization used in manufacture of a semiconductor device deteriorates other materials.

Conventional technology 2 also has a problem of a great difficulty in achieving high-speed operation because a pulse width of a voltage for changing a resistance value from a low resistance state to a high resistance state is considerably long that is 1 msec or more. Therefore, variable resistance elements with stable and high-speed operation are desired.

The present invention addresses the above-described problems. A primary object of the present invention is to provide a variable resistance element driving method of driving a variable resistance element with stability and at a high speed, and a nonvolatile storage device that can perform the method.

Means to Solve the Problems

In accordance with an aspect of the present invention for achieving the object, there is provided a method of driving a variable resistance element that includes a metal oxide having resistance values increased and decreased depending on application of electric pulses, the metal oxide including a first oxide layer and a second oxide layer which are stacked, the second oxide layer having an oxygen content percentage higher than an oxygen content percentage of the first oxide layer, the method including: performing a plurality of writing steps by applying a writing voltage pulse having a first polarity to the metal oxide, so as to change a resistance state of the metal oxide from high to low; and performing a plurality of erasing steps by applying an erasing voltage pulse having a second polarity to the metal oxide, so as to change the resistance state of the metal oxide from low to high, the second polarity being different from the first polarity, wherein $|Vw1|>|Vw2|$ is satisfied, where Vw1 represents a voltage value of the writing voltage pulse for first to N-th writing steps among the plurality of writing steps, where N is equal to or more than 1, and Vw2 represents a voltage value of the writing voltage pulse for (N+1)-th and subsequent writing steps among the plurality of writing steps, $|Ve1|>|Ve2|$ is satisfied, where Ve1 represents a voltage value of the erasing voltage pulse for first to M-th erasing steps among the plurality of erasing steps, where M is equal to or more than 1, and Ve2 represents a voltage value of the erasing voltage pulse for (M+1)-th and subsequent writing steps among the plurality of erasing steps, and the (N+1)-th writing step follows the M-th erasing step.

In the above-described method according to the aspect, it is preferable that $|Ve1|\geq|Vw1|$ and $|Ve2|\geq|Vw2|$ are further satisfied.

In the above-described method according to the aspect, it is also preferable that the method further includes: performing a recovery writing step by applying a recovery writing voltage pulse having a voltage value of Vw3, where $|Vw3|>|Vw2|$, to the metal oxide, so as to change the resistance state of the metal oxide from high to low, when any one of the (N+1)-th and subsequent writing steps fails to change the resistance state of the metal oxide from high to low; and performing a recovery erasing step by applying a recovery erasing voltage pulse having a voltage value of Ve3, where $|Ve3|>|Ve2|$, to the metal oxide, so as to change the resistance state of the metal oxide from low to high, when any one of the (M+1)-th and subsequence erasing steps fails to change the resistance state of the metal oxide from low to high.

In the above-described method according to the aspect, it is further preferable that the voltage value of Vw1 is equal to the voltage value of Vw3, and the voltage value of Ve1 is equal to the voltage value of Ve3.

In the above-described method according to the aspect, it is still further preferable that the first oxide layer comprises a tantalum oxide having a composition represented by $TaO_x$, where $0.8 \leq x \leq 1.9$, and the second oxide layer comprises a tantalum oxide having a composition represented by $TaO_y$, where $2.1 \leq y < 2.5$.

In accordance with another aspect of the present invention, there is provided a nonvolatile storage device including: a first electrode; a second electrode; a variable resistance element which is provided between the first electrode and the second electrode and which includes a metal oxide having a resistance value increased and decreased depending on application of electric pulses between the first electrode and the second electrode; and a drive unit, wherein the metal oxide includes a first oxide layer and a second oxide layer which are stacked, the second oxide layer having an oxygen content percentage higher than an oxygen content percentage of the first oxide layer, and the drive unit is configured to perform: a writing step by applying a writing voltage pulse having a first polarity between the first electrode and the second electrode, so as to change a resistance state of the metal oxide from high to low; and an erasing step by applying an erasing voltage pulse having a second polarity between the first electrode and the second electrode, so as to change the resistance state of the metal oxide from low to high, the second polarity being different from the first polarity, wherein $|Vw1|>|Vw2|$ is satisfied, where $Vw1$ represents a voltage value of the writing voltage pulse for first to N-th writing steps, where N is equal to or more than 1, and $Vw2$ represents a voltage value of the writing voltage pulse for (N+1)-th and subsequent writing steps, $|Ve1|>|Ve2|$ is satisfied, where $Ve1$ represents a voltage value of the erasing voltage pulse for first and M-th erasing steps, where M is equal to or more than 1, and Vet represents a voltage value of the erasing voltage pulse for (M+1)-th and subsequent erasing steps, and the (N+1)-th writing step follows the M-th erasing step.

In the above-described nonvolatile storage device according to the aspect, it is preferable that $|Ve1| \geq |Vw1|$ and $|Ve2| \geq |Vw2|$ are further satisfied.

In the above-described nonvolatile storage device according to the aspect, it is also preferable that the drive unit is configured to further perform: a recovery writing step by applying a recovery writing voltage pulse having a voltage value of $Vw3$, where $|Vw3|>|Vw2|$, between the first electrode and the second electrode, so as to change the resistance state of the metal oxide from high to low, when any one of the (N+1)-th and subsequence writing steps fails to change the resistance state of the metal oxide from high to low; and a recovery erasing step by applying a recovery erasing voltage pulse having a voltage value of $Ve3$, where $|Ve3|>|Ve2|$, between the first electrode and the second electrode, so as to change the resistance state of the metal oxide from low to high, when any one of the (M+1)-th and subsequent erasing step fails to change the resistance state of the metal oxide from low to high.

In the above-described nonvolatile storage device according to the aspect, it is further preferable that the voltage value of $Vw1$ is equal to the voltage value of $Vw3$, and the voltage value of $Ve1$ is equal to the voltage value of $Ve3$.

In the above-described nonvolatile storage device according to the aspect, it is still further preferable that the first oxide layer comprises a tantalum oxide having a composition represented by $TaO_x$, where $0.8 \leq x \leq 1.9$, and the second oxide layer comprises a tantalum oxide having a composition represented by $TaO_y$, where $2.1 \leq y < 2.5$.

In the above-described nonvolatile storage device according to the aspect, it is still further preferable that the nonvolatile storage device further includes a current steering element electrically connected to one of the first electrode and the second electrode. The current steering element may be a selection transistor. The current steering element may be a diode.

In accordance with still another aspect of the present invention, there is provided an initialization method of performing initialization for a variable resistance element which includes a metal oxide having a resistance value increased and decreased depending on application of electric pulses, the metal oxide including a first oxide layer and a second oxide layer which are stacked, the second oxide layer having an oxygen content percentage higher than an oxygen content percentage of the first oxide layer, to and from the variable resistance element, data being written and erase by performing one or more times a set of a writing step and an erasing step so as to perform at least one writing step and at least one erasing steps, the writing step being performed by applying a writing voltage pulse having a first polarity and a voltage value of $Vw2$ to the metal oxide, so as to change a resistance state of the metal oxide from high to low, and the erasing step being performed by applying an erasing voltage pulse having a second polarity and a voltage value of $Ve2$ to the metal oxide, so as to change the resistance state of the metal oxide from low to high, the second polarity being different from the first polarity, and the erasing step following the writing step, the method including: at least one initial writing step by applying a voltage pulse having the first polarity and a voltage value of $Vw1$, where $|Vw1|>|Vw2|$, to the metal oxide, so as to change the resistance state of the metal oxide from high to low; and at least one initial erasing step by applying a voltage pulse having the second polarity and a voltage value of $Ve1$, where $|Ve1|>|Ve2|$, to the metal oxide, so as to change the resistance state of the metal oxide from low to high, wherein a first one of the at least one writing step is performed next to a last one of the at least one initial erasing step.

Effects of the Invention

The method of driving a variable resistance element according to the present invention can vary a resistance of a variable resistance element with stability and at a high speed. In addition, the nonvolatile storage device that performs the method according to the present invention can be implemented as a storage device that can operate with stability and at a high speed.

BEST MODE FOR CARRYING OUT THE INVENTION

The following describes preferred embodiments according to the present invention with reference to the drawings.

First Embodiment

Structure of Variable Resistance Element

First, a structure of a variable resistance element according to the first embodiment is described.

Figure 1:
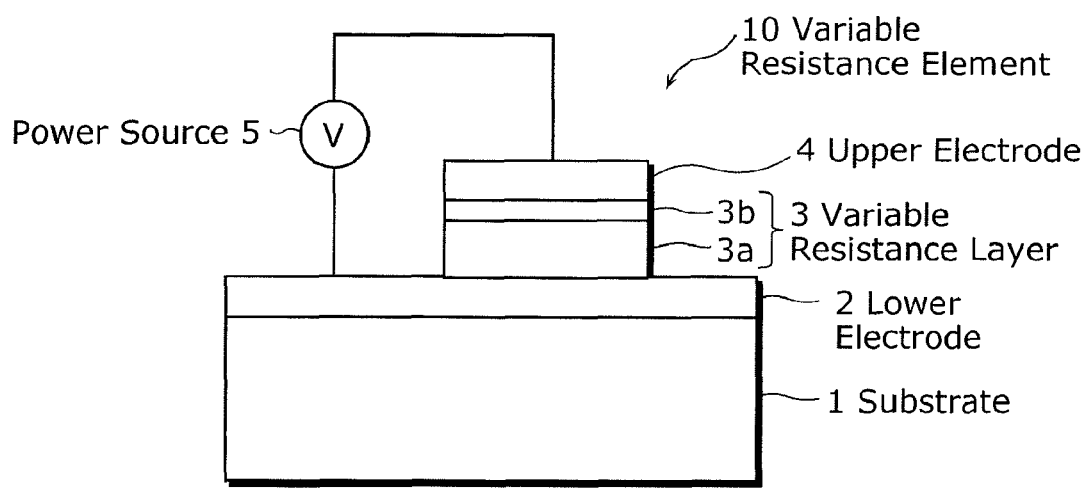
FIG. 1 is a schematic diagram showing an example of a structure of a variable resistance element according to the first embodiment of the present invention.

FIG. 1 is a schematic diagram showing an example of the structure of the variable resistance element according to the first embodiment of the present invention. As shown in FIG. 1, the variable resistance element 10 according to the first embodiment includes a substrate 1, a lower electrode 2 formed on the substrate 1, a variable resistance layer 3 formed on the lower electrode 2, an upper electrode 4 formed on the variable resistance layer 3. Each of the lower electrode 2 and the upper electrode 4 is electrically connected to the variable resistance layer 3.

The substrate 1 comprises a silicon substrate, for example. Each of the lower electrode 2 and the upper electrode 4 comprises at least one of materials gold (Au), platinum (Pt), iridium (Ir), and copper (Cu).

The variable resistance layer 3 comprises a first tantalum oxide layer 3a and a second tantalum oxide layer 3b which are stacked sequentially. Here, an oxygen content percentage of the second tantalum oxide layer 3b is higher than an oxygen content percentage of the first tantalum oxide layer 3a.

A resistance value of the variable resistance layer 3 can be varied, with stability and at a high speed, in the following situation. Assuming a composition of the first tantalum oxide layer 3a is $TaO_x$, x is within a range from 0.8 to 1.9, and assuming a composition of the second tantalum oxide layer 3b is $TaO_y$, y is within a range from 2.1 to 2.5. Therefore, it is preferable that x and y are within the above respective ranges.

Although a resistance value is varied if a thickness of the variable resistance layer 3 is 1 μm or less, the thickness is preferably equal to or less than 200 nm. This is because the thickness of 200 nm or less can facilitate manufacturing if lithography is used as a patterning process, and can lower a voltage value of a voltage pulse necessary to change a resistance value of the variable resistance layer 3. On the other hand, in order to surely prevent a breakdown (insulation breakdown) in application of a voltage pulse, a thickness of the variable resistance layer 3 is preferably at least 5 nm or more.

Regarding a thickness of the second tantalum oxide layer 3b, if the thickness is too large, there are drawbacks such as too high initial resistance value, and if too small, there are drawbacks of unstable resistance variation, for example. Therefore, the thickness of the second tantalum oxide layer 3b is preferably within a range approximately from 1 nm to 8 nm.

When the variable resistance element 10 having the above-described structure is to be operated, the lower electrode 2 and the upper electrode 4 are electrically connected to respective different terminals of a power source 5. The power source 5, which serves as an electric pulse applying device that drives the variable resistance element 10, has a structure for applying electric pulses (voltage pulses) having predetermined polarities, voltages, and time widths between the lower electrode 2 and the upper electrode 4.

It is assumed in the following description that a voltage of a voltage pulse applied between the electrodes is determined by a potential of the upper electrode 4 with reference to the lower electrode 2.

[Manufacturing Method of Variable Resistance Element]

Next, a method of manufacturing the variable resistance element 10 is described.

First, the lower electrode 2 having a thickness of 0.2 μm is formed on the substrate 1 by a sputtering method. Then, using a so-called reactive sputtering method for spattering a Ta target in argon gas and oxygen gas, a tantalum oxide layer is formed on the lower electrode 2. Here, an oxygen content percentage of the tantalum oxide layer can be easily adjusted by changing a ratio of a flow rate of the oxygen gas to a flow rate of the argon gas. The temperature of the substrate can be set as an ambient temperature, and heating is not necessary.

Next, a top surface of the tantalum oxide layer formed in the above manner is oxidized to be improved. Thereby, on the surface of the tantalum oxide layer has a range (second range) having an oxygen content percentage that is higher than that of the other range (first range) in which the oxidization is not applied. The first range corresponds to the first tantalum oxide layer 3a and the second range corresponds to the second tantalum oxide layer 3b. The first tantalum oxide layer 3a and the second tantalum oxide layer 3b which are manufactured in the above manner form the variable resistance layer 3.

Next, on the variable resistance layer 3 generated in the above manner, the upper electrode 4 having a thickness of 0.2 µm is formed by a sputtering method. As a result, the variable resistance element 10 is manufactured.

Here, a size and a shape of each of the lower electrode 2, the upper electrode 4, and the variable resistance layer 3 can be adjusted by a mask and a lithography. In the first embodiment, a size of each of the upper electrode 4 and the variable resistance layer 3 is set to be 0.5 µm×0.5 µm (an area of 0.25 µm$^2$), and a size of a part where the lower electrode 2 contacts the variable resistance layer 3 is set to be the same 0.5 µm×0.5 µm (an area of 0.25 µm$^2$).

Further, in the first embodiment, the first tantalum oxide layer 3a comprises a composition represented by $TaO_x$ (where x=1.54) and the second tantalum oxide layer 3b comprises a composition represented by $TaO_y$ (where y=2.47). Analysis on compositions of the oxide layers in the embodiments of the present invention always employs Rutherford Backscattering Spectrometry (RBS). Furthermore, a thickness of the variable resistance layer 3 is set to be 30 nm, a thickness of the first tantalum oxide layer 3a is set to be 22 nm, and a thickness of the second tantalum oxide layer 3b is set to be 8 nm.

It should be noted that the description of the first embodiment is given, assuming x=1.54 and y=2.47, but the present invention is not limited to this. If $0.8 \leq x \leq 1.9$ and $2.1 \leq y < 2.5$, stable resistance variation can be achieved like the variable resistance characteristics in the first embodiment.

[Operation of Variable Resistance Element]

The following describes operation of the variable resistance element 10 manufactured in the above-described manufacturing method.

In the following description, a high resistance state refers to a situation where a resistance value of the variable resistance layer 3 is high (for example, 20000Ω), and a low resistance state refers to a situation where the resistance value is low (for example, 700Ω).

When a writing voltage pulse that is a voltage pulse having a negative polarity is applied between the lower electrode 2 and the upper electrode 4 using the power source 5, the resistance value of the variable resistance layer 3 is decreased and thereby the variable resistance layer 3 is changed from a high resistance state to a low resistance state. This is called a writing step in the following description.

On the other hand, when an erasing voltage pulse that is a voltage pulse having a positive polarity is applied between the lower electrode 2 and the upper electrode 4 using the power source 5, the resistance value of the variable resistance layer 3 is increased and thereby the state of the variable resistance layer 3 is changed from a low resistance state to a high resistance state. This is called an erasing step in the following description.

Here, even if a voltage pulse having a negative polarity that is the same polarity of the writing voltage pulse is applied between the lower electrode 2 and the upper electrode 4 when the variable resistance layer 3 is in a low resistance state, the variable resistance layer 3 is not changed and is still in the low resistance state. Likewise, even if a voltage pulse having a positive polarity that is the same polarity of the erasing voltage pulse is applied between the lower electrode 2 and the upper electrode 4 when the variable resistance layer 3 is in a high resistance state, the variable resistance layer 3 is not changed and is still in the high resistance state.

By executing a writing step and an erasing step alternately, the variable resistance element 10 is operated. Here, so-called overwriting, which is successive execution of writing steps or successive execution of erasing steps, may be performed.

In the first embodiment, |Vw1|>|Vw2|, where Vw1 represents a voltage value of a writing voltage pulse (hereinafter, referred to as a "first writing voltage pulse") in writing steps (hereinafter, referred to as "first writing steps") from the first writing step to the N-th writing step (where N is equal to or more than 1), and Vw2 represents a voltage value of a writing voltage pulse (hereinafter, referred to as a "second writing voltage pulse") in writing steps (hereinafter, referred to as "second writing steps") of and subsequent to the (N+1)-th writing step.

In addition, |Ve1|>|Ve2|, where Ve1 represents a voltage value of an erasing voltage pulse (hereinafter, referred to as a "first erasing voltage pulse") in erasing steps (hereinafter, referred to as "first erasing steps") from the first erasing step to the M-th erasing step (where M is equal to or more than 1), and Ve2 represents a voltage value of an erasing voltage pulse (hereinafter, referred to as a "second erasing voltage pulse") in erasing steps (hereinafter, referred to as "second erasing steps") of and subsequent to the (M+1)-th erasing step.

Here, when overwriting is executed from the first writing, in other words, when a plurality of the first writing steps are performed successively, N in the above conditions is equal to or more than 2. Likewise, when a plurality of the first erasing steps are performed successively, M in the above conditions is equal to or more than 2.

Moreover, when a first writing step and a first erasing step are executed alternately and such execution is repeated, which is different from the above overwriting, each of N and M is equal to or more than 2.

Although each of N and M is equal to or more than 2 as described above, a second writing step should follow a first erasing step whatever N and M are. In other words, it is necessary that there is a first erasing step between a first writing step and a second writing step, thereby preventing that the first writing step and the second writing step are executed successively. If a second writing step does not follow a first erasing step and the second writing step follows a first writing step, it is difficult to achieve stable resistance variation.

Figure 2:
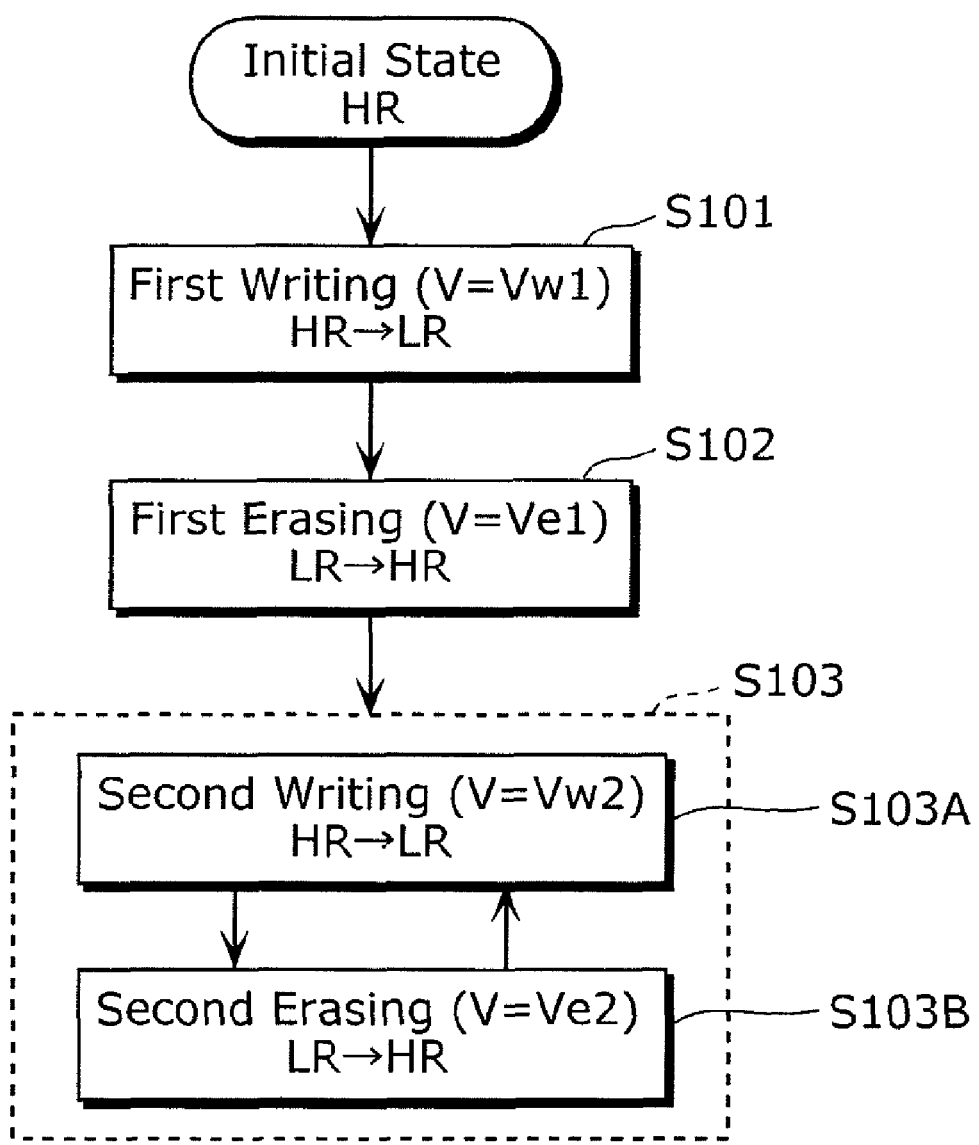
FIG. 2 is a flowchart of steps of a method of driving the variable resistance element according to the first embodiment of the present invention.

The above-described method of driving the variable resistance element 10 according to the first embodiment of the present invention is presented by a flowchart of FIG. 2. First, a first writing step is executed by applying a voltage pulse having a voltage value Vw1 (S101). Thereby, the state of the variable resistance layer 3 is changed from an initial high resistance state (HR) to a low resistance state (LR). Next, a first erasing step is executed by applying a voltage pulse having a voltage value Ve1 (S102). Thereby, the state of the variable resistance layer 3 is changed from the low resistance state to a high resistance state.

After that, Step 103 for repeating a pair of a second writing step and a second erasing step is executed. More specifically, a second writing step using a voltage pulse having a voltage value Vw2 (S103A) and a second erasing step using a voltage pulse having a voltage value Vet (S103B) are repeated alternately. The execution of Step S103A changes the state of the variable resistance layer 3 from a high resistance state to a low resistance state, while the execution of Step S103B changes the state of the variable resistance layer 3 from a low resistance state to a high resistance state.

As described above, if at least one of N and M in the conditions is equal to or more than 2, at least one of Steps S101 and S102 is repeated.

The present invention does not limit any details for implementing the steps in the flowchart of FIG. 2. For instance, Steps S101 and S102 may be performed before shipment of a manufactured variable resistance element, as initialization for the variable resistance element. And, Step S102 may be performed when a user actually uses the variable resistance element (namely, writes or erases data).

As described in more detail later, execution of Steps S101 and S102 for a variable resistance element having an initial resistance state after manufacturing can provide the variable resistance element with stable high-speed operation and good endurance characteristics. Therefore, Steps S101 and S102 are executed for a variable resistance element before its shipment in order to confirm a desired change in its resistance state. Thereby, it is possible to perform, at once, the examination for production quality and the improvement of operation characteristics.

Figure 3:
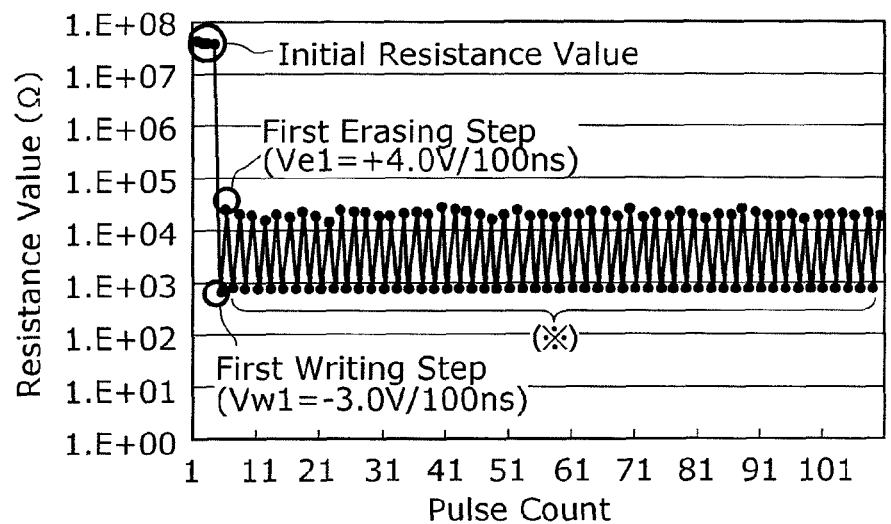
FIG. 3 is a graph plotting an example of variation of a resistance state of a variable resistance layer.

FIG. 3 is a graph showing an example of variation of a resistance state of the variable resistance layer 3. In this example, a voltage value Vw1 of the first writing voltage pulse is assumed to be −3.0 V, and a voltage value Vw2 of the second writing voltage pulse is assumed to be −2.0 V. In addition, a voltage value Ve1 of the first erasing voltage pulse is assumed to be +4.0 V, and a voltage value Vet of the second writing voltage pulse is assumed to be +2.5 V. Here, in any cases, a pulse width is assumed to be 100 ns. It is also assumed in the graph that a first writing step is executed once and a first erasing step is executed once.

FIG. 3 shows stable variation of the resistance state of the variable resistance layer 3. As shown in FIG. 3, application of voltage pulses between the two electrodes satisfying |Vw1|>|Vw2| and |Ve1|>|Ve2| allows the variable resistance element 10 to be operated with stability. The first embodiment satisfies also the conditions of |Ve1|≧|Vw1| and |Ve2|≧|Vw2|, which is considered as one of causes of the stable operation of the variable resistance element 10.

The following describes the situation where the variable resistance element 10 is implemented as a memory, to and from which data having one bit is written and read out. In the following case, "1" represents a low resistance state of the variable resistance layer 3, and "0" represents a high resistance state of the variable resistance layer 3.

Figure 4:
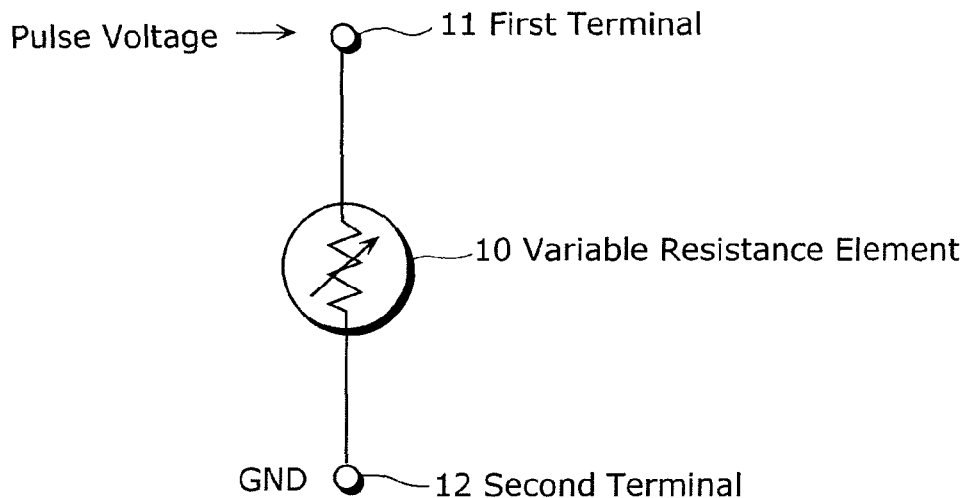
FIG. 4 is a diagram showing an example of a structure of a circuit operating the variable resistance element and an operation example of the case where data is written to the variable resistance element according to the first embodiment of the present invention.

FIG. 4 is a diagram showing an example of a structure of a circuit operating the variable resistance element 10 according to the first embodiment of the present invention and an operation example of the case where data is written to the variable resistance element 10. As shown in FIG. 4, the circuit includes the variable resistance element 10, a first terminal 11, and a second terminal 12. The upper electrode 4 of the variable resistance element 10 is electrically connected to the first terminal 11, and the lower electrode 2 of the variable resistance element 10 is electrically connected to the second terminal 12.

Figure 5:
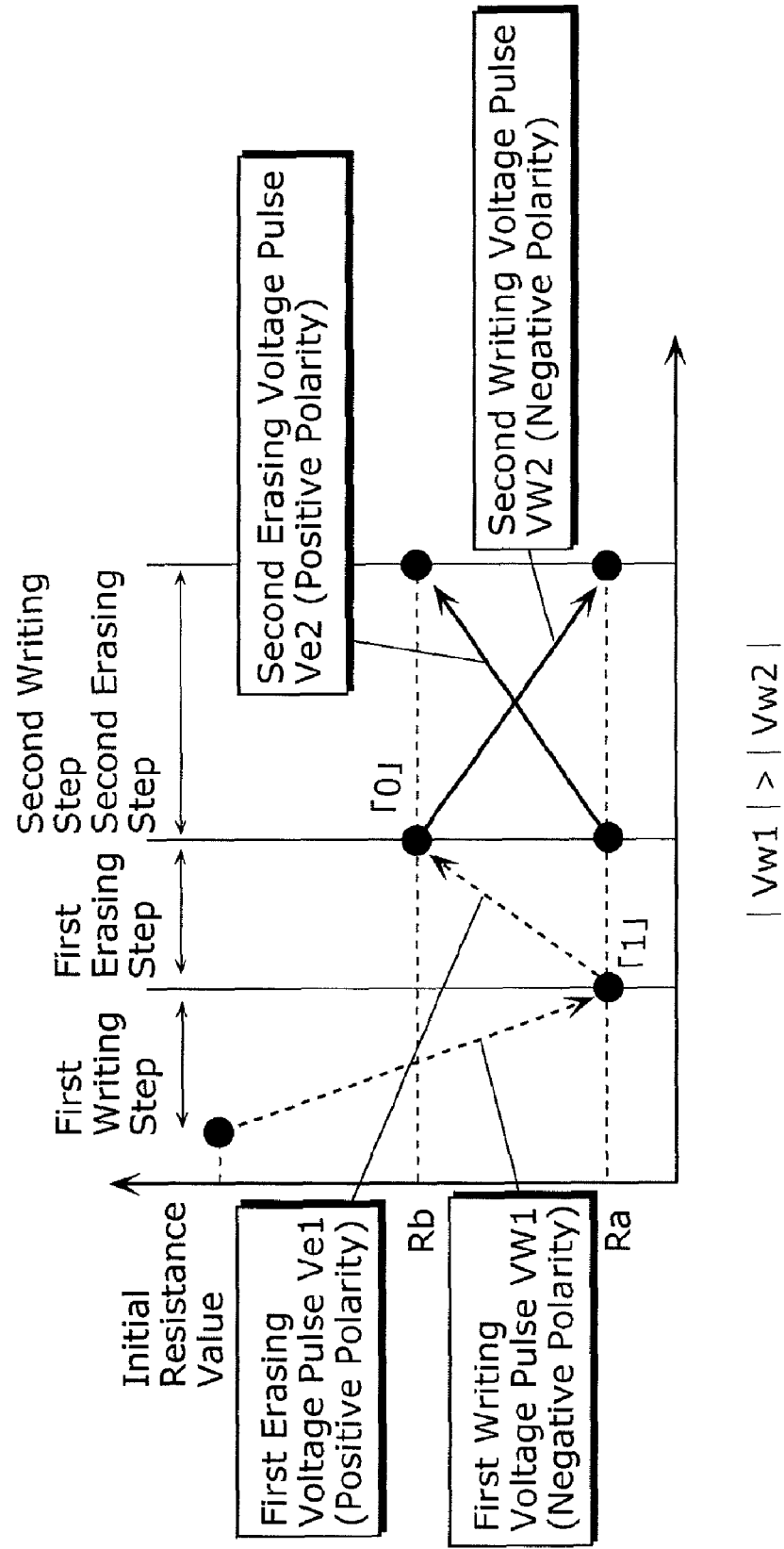
FIG. 5 is a graph plotting variation of a resistance value of the variable resistance layer in the case where data is written to and erased from the variable resistance element according to the first embodiment of the present invention.

FIG. 5 is a graph plotting variation of resistance values of the variable resistance layer 3 in the case where data is written to (writing step) and erased from (erasing step) the variable resistance element 10 according to the first embodiment of the present invention. In the writing step and the erasing step, as shown in FIG. 4, the second terminal 12 is grounded (GND) and a voltage pulse is provided to the first terminal 11.

The voltage pulse is determined with reference to the lower electrode 2 and a ground point.

When the variable resistance element 10 is in an initial state (in other words, a resistance value of the variable resistance layer 3 is an initial resistance value), a first writing voltage pulse having a negative polarity (voltage value Vw1) is provided to the first terminal 11. Thereby, as shown in FIG. 5, a resistance value of the variable resistance layer 3 is decreased from the initial resistance value and the variable resistance layer 3 gets in a low resistance state Ra. As a result, one bit data indicating "1" is written to the variable resistance element 10. Next, when a first erasing voltage pulse having a positive polarity (voltage value Ve1) is provided to the first terminal 11, the state of the variable resistance layer 3 is changed from the low resistance state Ra to a high resistance state Rb. As a result, one bit data indicating "0" is written to the variable resistance element 10.

Then, if, in the high resistance state Rb of the variable resistance layer 3, a second writing voltage pulse having a negative polarity (voltage value Vw2) is provided to the first terminal 11, the high resistance state Rb of the variable resistance layer 3 is changed to the low resistance state Ra. On the other hand, if, in the low resistance state Ra of the variable resistance layer 3, a second erasing voltage pulse having a positive polarity (voltage value Ve2) is provided to the first terminal 11, the low resistance state Ra of the variable resistance layer 3 is changed to the high resistance state Rb.

In the circuit, when a voltage pulse is supplied to the first terminal 11 satisfying |Vw1|>|Vw2| and |Ve1|>|Ve2| as described above, the variable resistance element 10 can serve as a memory in which the variable resistance element 10 operates with stability and at a high speed.

Figure 6:
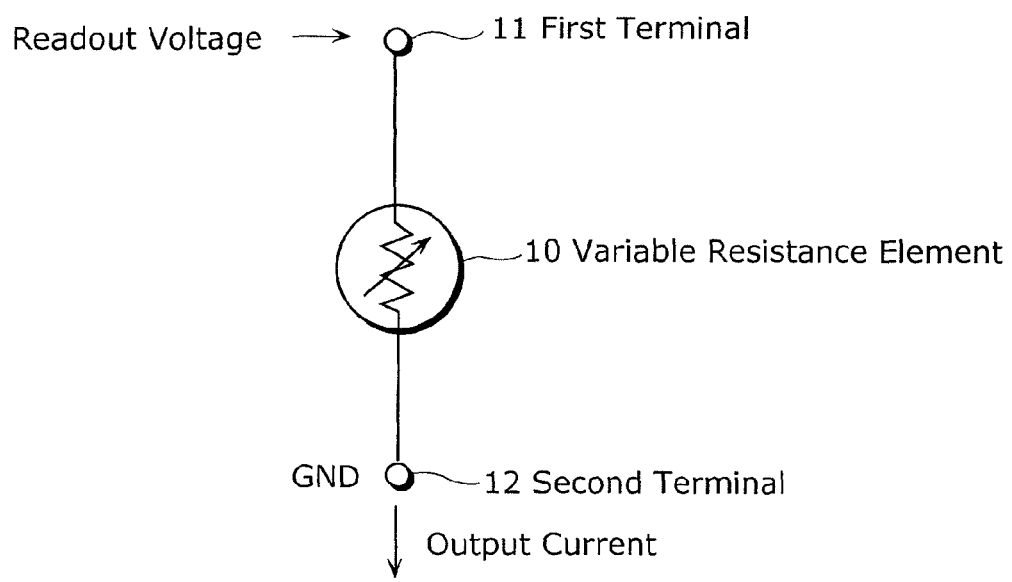
FIG. 6 is a diagram showing an example of a structure of a circuit operating the variable resistance element and an operation example of the case where data is read out from the variable resistance element according to the first embodiment of the present invention.

FIG. 6 is a diagram showing an example of a structure of a circuit operating the variable resistance element 10 according to the first embodiment of the present invention and an operation example of the case where data is read out from the variable resistance element 10. As shown in FIG. 6, when data is to be read out, the second terminal 12 is grounded (GND), and a readout voltage is provided to the first terminal 11. The readout voltage is determined with reference to the lower electrode 2 and a ground point.

Figure 7:
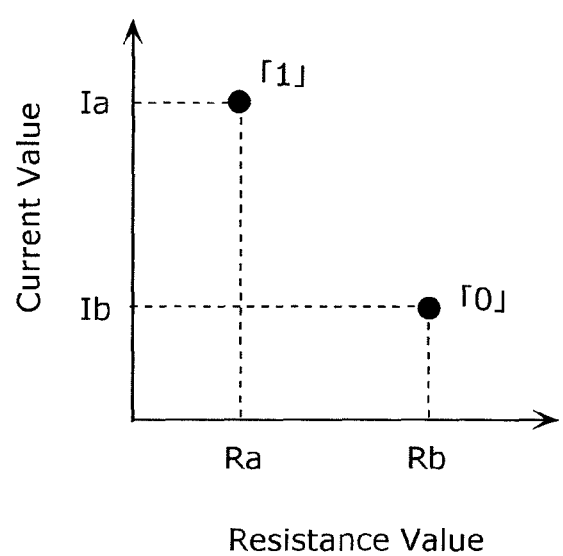
FIG. 7 is a graph plotting a relationship between (a) a current value of current flowing in a circuit having the variable resistance element and (b) a resistance value of a variable resistance layer, when data is read out, according to the first embodiment of the present invention.

FIG. 7 is a graph plotting a relationship between (a) a current value of current flowing in a circuit having the variable resistance element 10 according to the first embodiment of the present invention and (b) a resistance value of the variable resistance layer 3, when data is read out. When a readout voltage is provided to the first terminal 11, current depending on the resistance value of the variable resistance layer 3 flows in the circuit. More specifically, as shown in FIG. 7, when the variable resistance layer 3 is in the low resistance state Ra, current having a current value Ia flows in the circuit, while when the variable resistance layer 3 is in the high resistance state Rb, current having a current value Ib flows in the circuit.

When the second terminal 12 is grounded as shown in FIG. 6 and a readout voltage of +0.5 V, for example, is provided to the first terminal 11, a current value of the current flowing between the first terminal 11 to the second terminal 12 is detected to determine whether the variable resistance layer 3 is in the high resistance state or in the low resistance state. More specifically, if the detected current value is Ia, it is determined that the variable resistance layer 3 is in the low resistance state Ra. As a result, it is learned that data written to the variable resistance element 10 is "1". On the other hand, if the detected current value is Ib, it is determined that the variable resistance layer 3 is in the high resistance state Rb. As a result, it is learned that data written to the variable resistance element 10 is "0". As described above, data is read out from the variable resistance element 10.

A resistance value of the variable resistance element 10 according to the first embodiment is not changed even if the variable resistance element 10 is powered off. Therefore, the variable resistance element 10 can be implemented as a nonvolatile storage device.

Figure 8A:
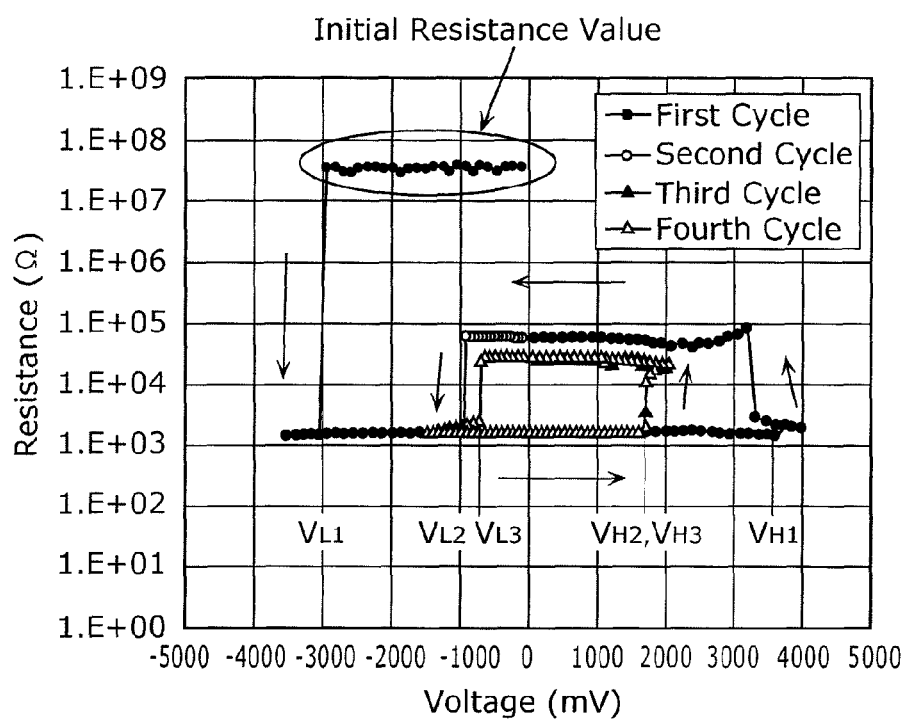
FIG. 8A is a graph plotting hysteresis characteristics of variation of a resistance value of a variable resistance layer 3 in the case where the variable resistance element is applied with plural different electric pulses by sequentially varying a voltage value, according to the first embodiment of the present invention.

FIG. 8A is a graph plotting hysteresis characteristics of variation of a resistance value of the variable resistance layer 3 in the case where the variable resistance element 10 according to the first embodiment of the present invention is applied with plural different electric pulses by sequentially varying a voltage value. In the variable resistance element 10 in the examination, the variable resistance layer 3 has a thickness of 30 nm, the first tantalum oxide layer 3a has a thickness of 22 nm, and the second tantalum oxide layer 3b has a thickness of 8 nm. A composition of the first tantalum oxide layer 3a is x=1.54 where tantalum oxide is expressed as $TaO_x$, and a composition of the second tantalum oxide layer 3b is y=2.47 where tantalum oxide is expressed as $TaO_y$.

As shown in FIG. 8A, while a voltage value of the voltage pulse is changed from 0 V and reaches approximately −3.0 V, a resistance value of the variable resistance layer 3 remains as an initial resistance value. When the voltage value of the voltage pulse reaches a threshold voltage $V_{L1}$ that is approximately −3.0 V, the resistance value is dramatically decreased. Then, while the voltage value of the voltage pulse is changed from approximately −3.0 V to approximately −3.5 V that is the lowest voltage, and reaches approximately +3.5 V, the resistance value of the variable resistance layer 3 remains low. When the voltage value reaches a threshold value $V_{H1}$ that is approximately +3.5 V, the resistance value is getting increased. While the voltage value is changed from the highest voltage that is approximately +4.0 V and reaches approximately +3.3 V, the resistance value of the variable resistance layer 3 is dramatically increased. Then, while the voltage value of the voltage pulse is changed from approximately +3.3 V to 0 V, the resistance value of the variable resistance layer 3 remains high. This is track of a "first cycle" shown by black dots in FIG. 8A.

Next, while the voltage value of the voltage pulse is changed from 0 V and reaches approximately −1.0 V, the resistance value of the variable resistance layer 3 remains high. When the voltage value reaches a threshold voltage $V_{L2}$ that is approximately −1.0 V, the resistance value is dramatically decreased. Then, while the voltage value of the voltage pulse is changed from approximately −1.0 V to approximately −1.5 V that is the lowest voltage, and reaches approximately +1.7 V, the resistance value of the variable resistance layer 3 remains low. When the voltage value reaches a threshold value $V_{H2}$ that is approximately +1.7 V, the resistance value is dramatically increased. Then, while the voltage value is changed from the highest voltage that is from approximately +1.7 V to approximately +2.0 V and reaches 0 V, the resistance value of the variable resistance layer 3 remains high. This is track of a "second cycle" shown by white dots in FIG. 8A.

Further, while the voltage value of the voltage pulse is changed from 0 V and reaches approximately −0.7 V, the resistance value of the variable resistance layer 3 remains high. When the voltage value reaches a threshold voltage $V_{L3}$ that is approximately −0.7 V, the resistance value is dramatically decreased. Then, while the voltage value of the voltage pulse is changed from approximately −0.7 V to approximately −1.5 V that is the lowest voltage, and reaches approximately +1.7 V, the resistance value of the variable resistance layer 3 remains low. When the voltage value reaches a threshold old value $V_{H3}$ that is approximately +1.7 V, the resistance value is dramatically increased. Then, while the voltage value is changed from approximately +1.7 V that is the highest voltage to approximately +2.0 V, and reaches 0 V, the resistance value of the variable resistance layer 3 remains high. This is track of a "third cycle" shown by black triangles in FIG. 8A. A track of a "fourth cycle" shown by white triangles is the same as the track of the "third cycle".

Furthermore, the same examination is conducted on the variable resistance element 10 that includes the variable resistance layer having a different thickness. In the variable resistance element with the different thickness, the variable resistance layer 3 has a thickness of 50 nm, the first tantalum oxide layer 3a has a thickness of 45 nm, and the second tantalum oxide layer 3b has a thickness of 5 nm. A composition of the first tantalum oxide layer 3a is x=1.54 where tantalum oxide is expressed as $TaO_x$, and a composition of the second tantalum oxide layer 3b is y=2.47 where tantalum oxide is expressed as $TaO_y$.

Figure 8B:
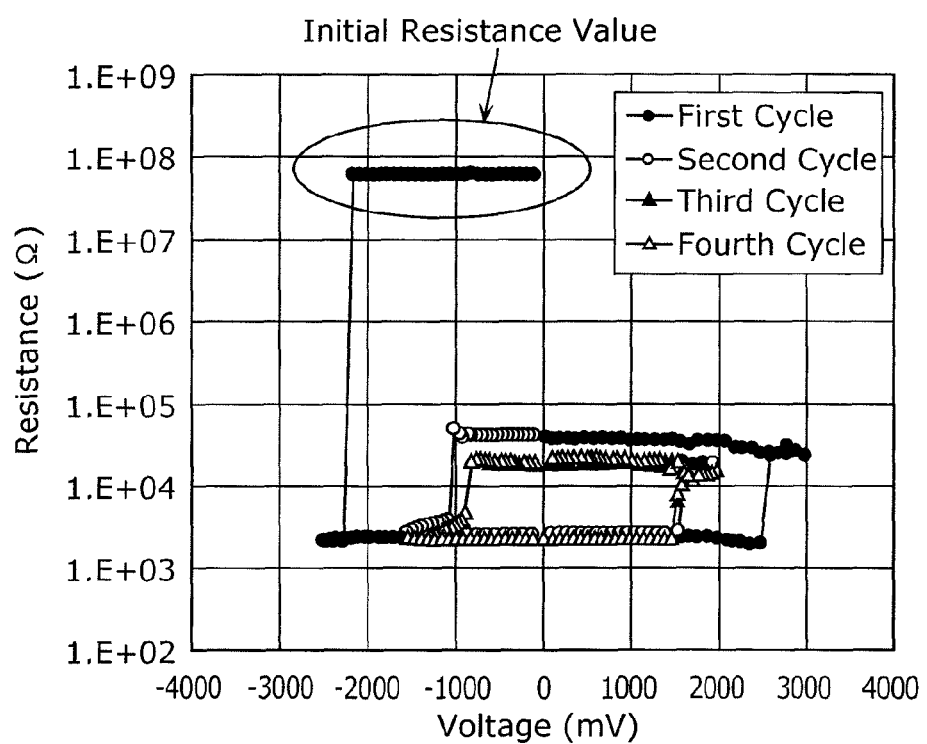
FIG. 8B is a graph plotting hysteresis characteristics of another variable resistance element which is manufactured to have a different thickness of the variable resistance layer.

FIG. 8B is a graph plotting hysteresis characteristics of the above variable resistance element. Although characteristics of the variable resistance element of FIG. 8B differs from that of the variable resistance element 10 regarding FIG. 8A in a value of each threshold value voltage, both characteristics show similar forms in the graphs.

Results of plural examinations including results of FIGS. 8A and 8B show that hysteresis characteristics of a variable resistance element has the following general properties.

(i) An absolute value of a threshold value voltage $V_{Ln}$ that causes a resistance change to low resistance state in the variable resistance layer in the n-th cycle (where n is equal to or more than 1) is maximum in the first cycle where the variable resistance layer is in the initial resistance state, and is decreased in and after the second cycle.

(ii) In each cycle, an absolute value of a threshold value voltage $V_{Hn}$ that produces a high resistance state of the variable resistance layer is equal to or greater than an absolute value of a minimum voltage of a voltage pulse having a negative polarity that is applied to achieve a low resistance state of the variable resistance layer in the corresponding cycle.

In FIG. 8A, although a resistance value of the variable resistance layer with a threshold value voltage $V_{H1}$ in the first cycle is getting increased, the variable resistance layer is not immediately changed to have a high resistance state. Later observation shows that the above relates to a protection resistance inserted in series in the examination circuit. When a value of the protection resistance is selected appropriately depending on a thickness of the variable resistance layer, hysteresis characteristics plotted in the graph of FIG. 8B, for example, are obtained.

The above-described results show that a first writing step and a first erasing step can be executed when, according to the voltage value hysteresis characteristics of FIG. 8A for example, a voltage value Vw1 of a first writing voltage pulse is set to be −3.5 V that is lower than the threshold value voltage $V_{L1}$ of approximately −3.0 V and a voltage value Ve1 of a first erasing voltage pulse is set to be approximately +4.0 V that is higher than the Vw1.

In addition, since $|V_{L1}|>|V_{L2}|$ and $|V_{H1}|>|V_{H2}|$, it is appropriate that a voltage value Vw2 of a second writing voltage pulse is set to be within a range approximately from −0.7 V to −2.5 V and that a voltage value Ve2 of a second erasing voltage pulse is set to be within a range approximately from +1.7 V to +3.5 V, in order to satisfy the conditions |Vw1|>|Vw2| and |Ve1|>|Ve2|. Therefore, as described previously with reference to FIG. 2, in the first embodiment, Vw1 is set to be −3.0 V, Vw2 is set to be −2.0 V, Ve1 is set to be +4.0 V, and Ve2 is set to be +2.5 V.

Next, how a size relationship among voltage values of respective voltage pulses influences endurance characteristics of the variable resistance element is described.

Figure 9:
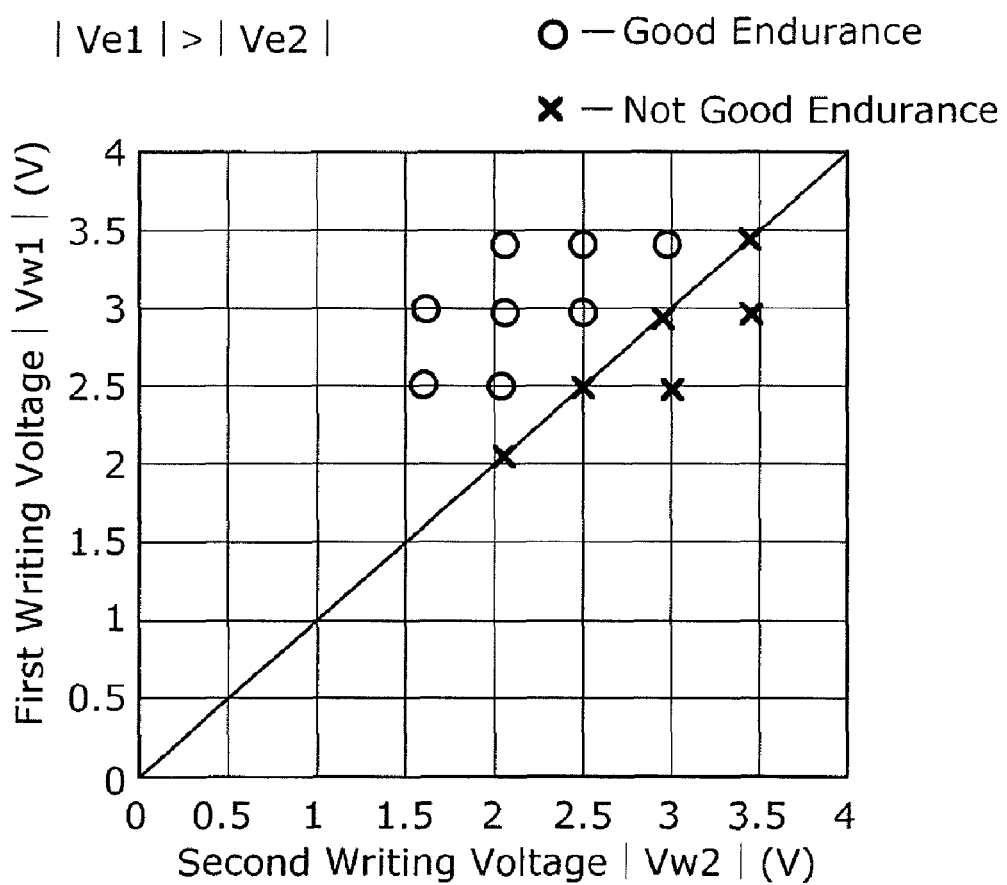
FIG. 9 is a graph plotting a result of examination for quality of endurance characteristics in the case of |Ve1|>|Ve2|.
Figure 10:
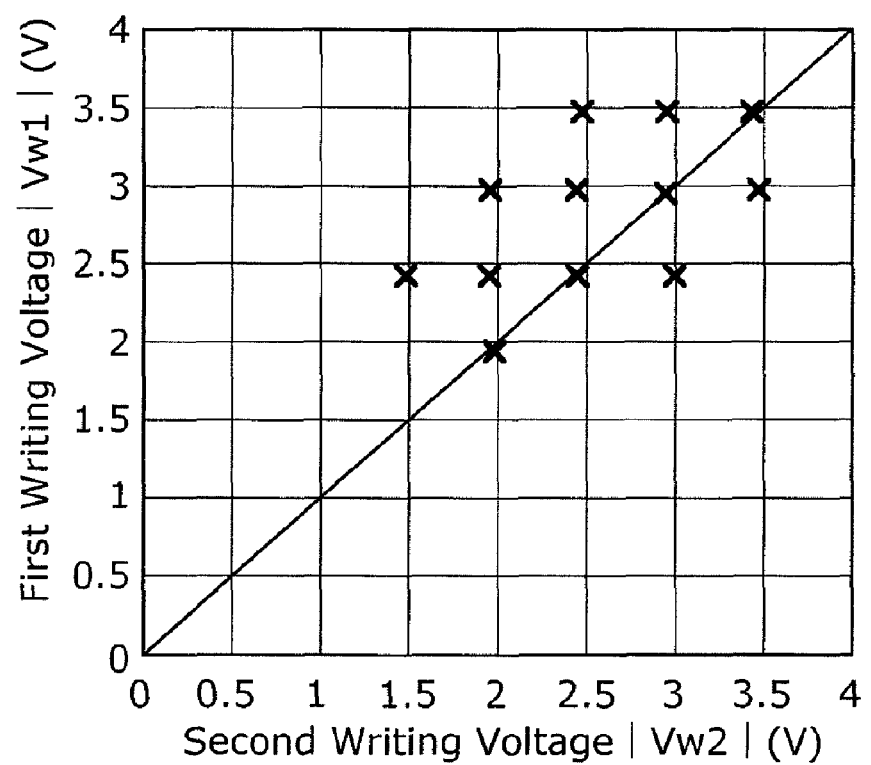
FIG. 10 is a graph plotting a result of examination for quality of endurance characteristics in the case of |Ve1|≦|Ve2|.

FIG. 9 is a graph plotting a result of examination for quality of endurance characteristics in the case of |Ve1|>|Ve2|. FIG. 10 is a graph plotting a result of examination for quality of endurance characteristics in the case of |Ve1|≦|Ve2|. In the graphs, if a stable resistance variation is repeated one hundred times, then endurance characteristics are determined as good (shown by circles), and otherwise, endurance characteristics are determined as not good (shown by X marks).

As shown in FIG. 9, if both |Ve1|>|Ve2| and |Vw1|>|Vw2| are satisfied, endurance characteristics are good. On the other hand, as shown in FIGS. 9 and 10, if at least one of |Ve1|>|Ve2| and |Vw1|>|Vw2| is not satisfied, endurance characteristics are not good.

The variable resistance element 10 according to the first embodiment satisfies both |Ve1|>|Ve2| and |Vw1|>|Vw2|. Therefore, the results of the above examination prove that the variable resistance element 10 according to the first embodiment has good endurance characteristics.

First Comparative Example

The following describes a variable resistance element according to a first comparative example. A structure of the variable resistance element according to the first comparative example is the same as that of the variable resistance element 10 in the first embodiment. Therefore, the structure of the variable resistance element is not described below.

Figure 11:
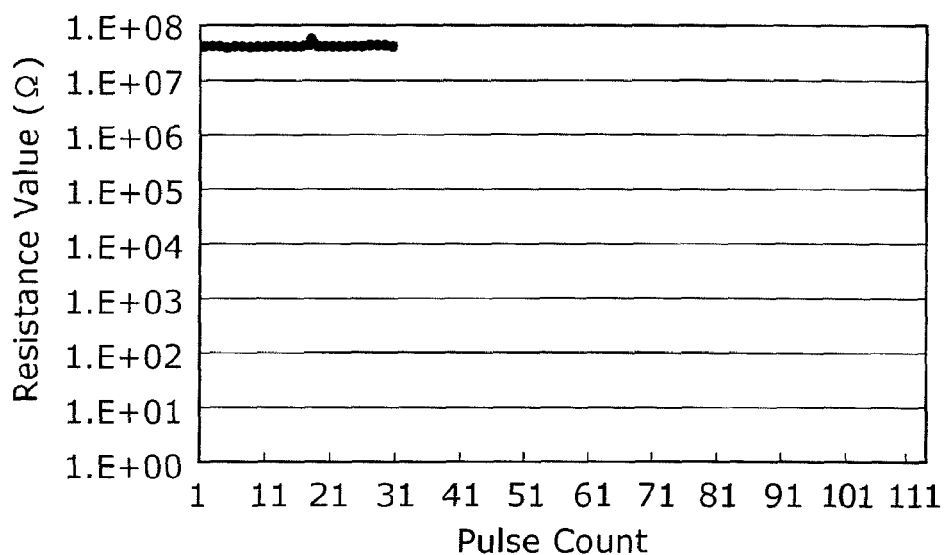
FIG. 11 is a graph plotting variation of a resistance state of a variable resistance layer included in a variable resistance element in a first comparative example, in the case where a voltage value of a first writing voltage pulse and a voltage value of a second writing voltage pulse are the same −2.0 V and a voltage value of a first erasing voltage pulse and a voltage value of a second erasing voltage pulse are the same +2.5 V.

FIG. 11 is a graph plotting variation of a resistance state of a variable resistance layer included in the variable resistance element according to the first comparative example in the case where both a voltage value Vw1 of a first writing voltage pulse and a voltage value Vw2 of a second writing voltage pulse are the same −2.0 V and both a voltage value Ve1 of a first erasing voltage pulse and a voltage value Ve2 of a second erasing voltage pulse are the same +2.5 V. Here, in any cases, a pulse width is assumed to be 100 ns.

As shown in FIG. 11, in the first comparative example, a resistance value of the variable resistance layer remains in an initial resistance value and does not show any change in its resistance state. Therefore, the variable resistance element according to the first comparative example cannot be used as a memory.

Second Comparative Example

The following describes a variable resistance element according to a second comparative example. A structure of the variable resistance element according to the second comparative example is the same as that of the variable resistance element 10 in the first embodiment. Therefore, the structure of the variable resistance element is not described below.

Figure 12:
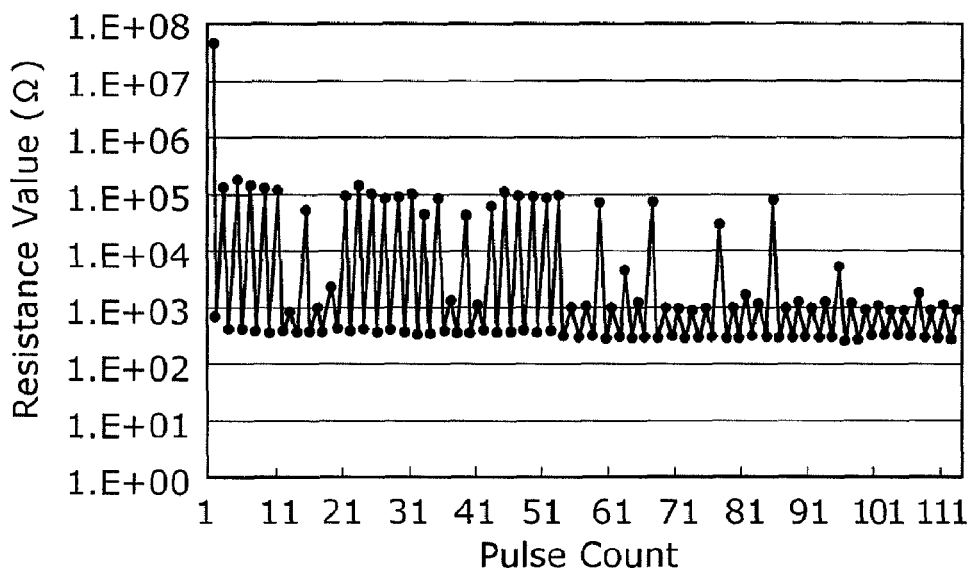
FIG. 12 is a graph plotting variation of a resistance state of a variable resistance layer included in a variable resistance element in a second comparative example, in the case where a voltage value of a first writing voltage pulse and a voltage value of a second writing voltage pulse are the same −2.5 V and a voltage value of a first erasing voltage pulse and a voltage value of a second erasing voltage pulse are the same +3.5 V.

FIG. 12 is a graph plotting variation of a resistance state of a variable resistance layer included in the variable resistance element according to the second comparative example in the case where both a voltage value Vw1 of a first writing voltage pulse and a voltage value Vw2 of a second writing voltage pulse are the same −3.0 V and both a voltage value Ve1 of a first erasing voltage pulse and a voltage value Ve2 of a second erasing voltage pulse are the same +4.0 V. Here, in any cases, a pulse width is assumed to be 100 ns.

As shown in FIG. 12, in the second comparative example, a resistance state of the variable resistance layer are varied up to a pulse count of 10. However, after that, a difference in a resistance value between a low resistance state and a high resistance state is sometimes considerably small. Then, at and after a pulse count of 90, the difference is always small.

The first and second comparative examples show that a variable resistance element with stable operation cannot be achieved when |Vw1|=|Vw2| and |Ve1|=|Ve2|. On the other hand, the variable resistance element 10 according to the first embodiment can achieve stable operation as shown in FIG. 3.

Second Embodiment

As described above, the driving method according to the first embodiment allows the variable resistance element 10 to have good endurance characteristics. However, in very rare cases, writing in a second writing step and a second erasing step fail (in other words, the variable resistance layer is not changed to have a desired resistance state). A variable resistance element according to a second embodiment of the present invention addresses the above drawback and can achieve more stable operation by executing a recovery writing step and a recovery erasing step when the above failures occurs.

Figure 13:
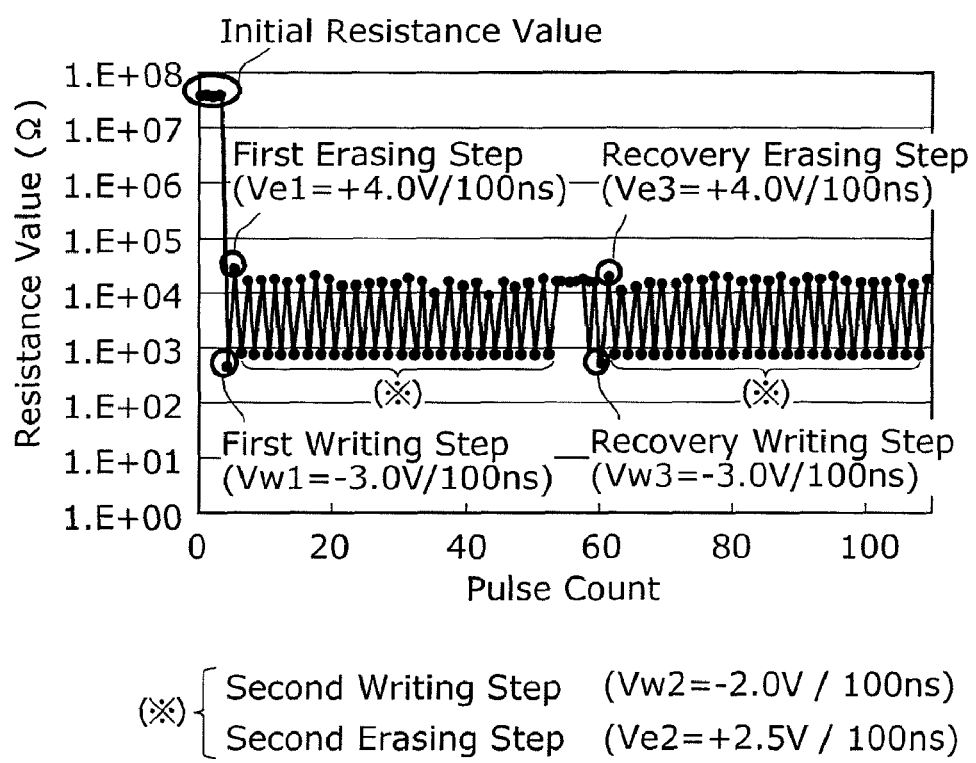
FIG. 13 is a graph plotting an example of variation of a resistance state of a variable resistance layer included in a variable resistance element according to a second embodiment of the present invention.

FIG. 13 is a graph plotting an example of variation of a resistance state of a variable resistance layer by a method of driving the variable resistance element according to the second embodiment of the present invention. FIG. 13 shows an example of variation of a resistance state of the variable resistance layer when the second writing step fails in the case where, after execution of the first writing step and the first erasing step, the second writing voltage pulse (having a voltage value Vw2 of −2.0 V and a pulse width of 100 ns) is applied in the second writing step and the second erasing voltage pulse (having a voltage value Ve2 of +2.5 V and a pulse width of 100 ns) is applied in the second erasing step.

A failure in the writing step is detected in a verification step for verifying whether or not the variable resistance layer is in a desired resistance state after being applying with a voltage pulse (for example, whether or not the variable resistance layer is in the low resistance state if detection is performed after the second writing step).

In the example shown in FIG. 13, after the writing failure, a recovery writing voltage pulse (having a voltage value Vw3 of −3.0 V and a pulse width of 100 ns) is applied in a recovery writing step, and then a recovery erasing voltage pulse (having a voltage value Ve3 of +4.0 V and a pulse width of 100 ns) is applied in a following recovery erasing step. Here, an absolute value of the voltage value Vw3 of the recovery writing voltage pulse is greater than an absolute value of the voltage value Vw2 of the second writing voltage pulse, and an absolute value of the voltage value Ve3 of the recovery erasing voltage pulse is greater than an absolute value of the voltage value Ve2 of the second erasing voltage pulse. For example, as shown in FIG. 13, it is possible that Vw3=Vw1 and Ve3=Ve1.

By referring to FIG. 13, it is confirmed that, after writing failure, the recovery writing voltage pulse having the same voltage value as that of the first writing voltage pulse and the recovery erasing voltage pulse having the same voltage value as that of the first erasing voltage pulse are applied, which results in following stable variation of the resistance state.

Figure 14:
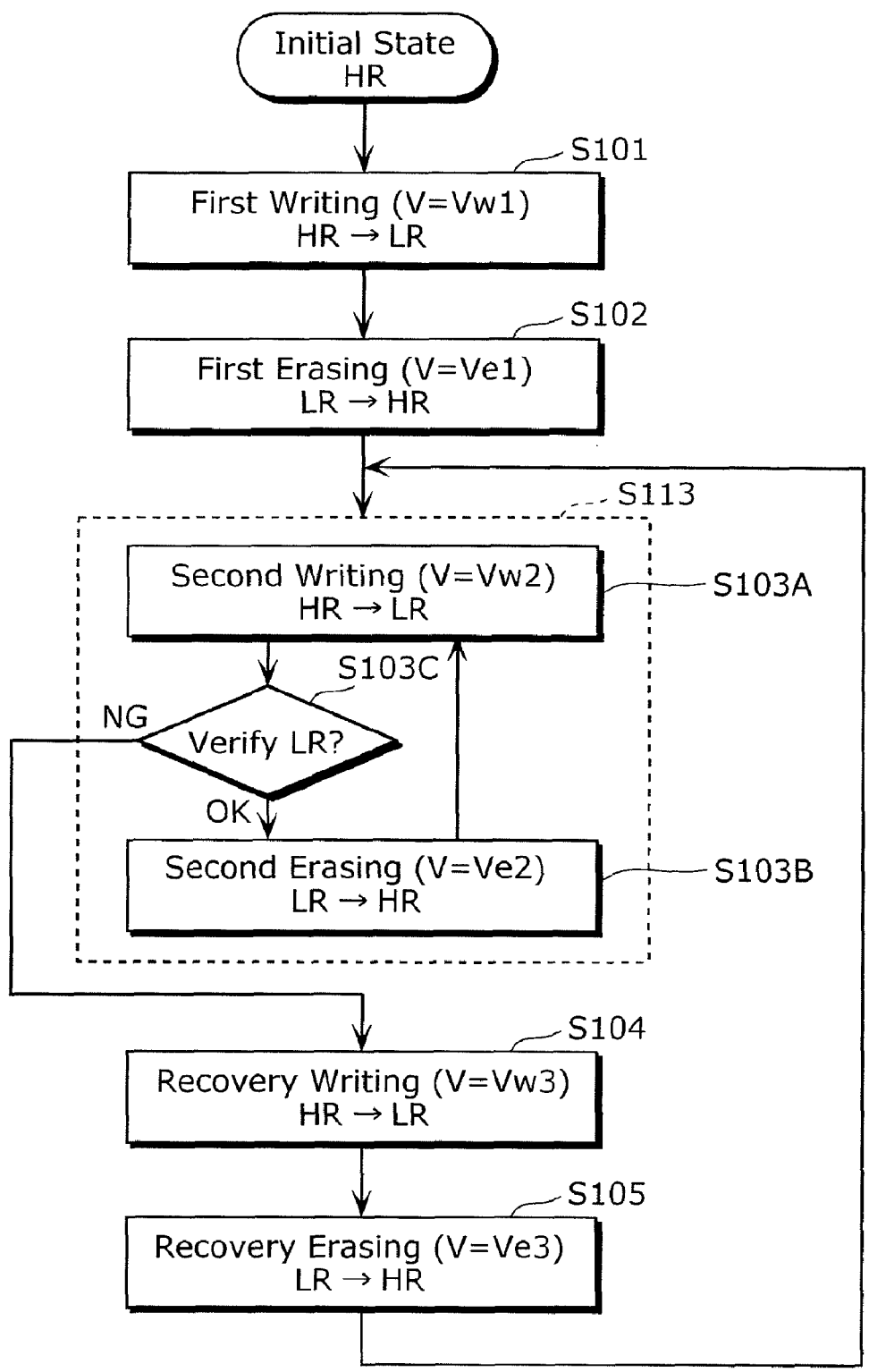
FIG. 14 is a flowchart of steps of a method of driving the variable resistance element according to the second embodiment of the present invention.

The above-described method of driving the variable resistance element according to the second embodiment of the present invention is presented by a flowchart of FIG. 14. First, a first writing step is executed by applying a voltage pulse having a voltage value Vw1 (S101). Thereby, the state of the variable resistance layer 3 is changed from an initial high resistance state (HR) to a low resistance state (LR). Next, a first erasing step is executed by applying a voltage pulse having a voltage value Ve1 (S102). Thereby, the state of the variable resistance layer is changed from the low resistance state to a high resistance state.

After that, Step S113 for repeating a set of a second writing step, a verification step, and a second erasing step is executed. More specifically, Step S113 is repetition of a set of: the second writing step (S103A) using a voltage pulse of a voltage value Vw2; the verification step (S103C) using a readout voltage that is too low to change the resistance state of the variable resistance layer; and the second erasing step (S103B) using a voltage pulse of a voltage value Vet.

In the verification step (S103C), it is verified whether or not the variable resistance layer is in a desired resistance state, by applying a read voltage to the variable resistance element and comparing a current value of current flowing in the variable resistance element to a threshold value.

If the verification step detects that the variable resistance layer is not in the desired low resistance state (NG at S103C), then a recovery writing step is executed using a voltage pulse of a voltage value Vw3 (for example, Vw3=Vw1) (S104). Thereby, the state of the variable resistance layer is changed from the high resistance state (HR) to the low resistance state (LR). Next, a recovery erasing step is executed using a voltage pulse of a voltage value Ve3 (for example, Ve3=Ve1) (S105). Thereby, the state of the variable resistance layer is changed from the low resistance state to the high resistance state.

Then, Step S113 is executed to repeat the set of the second writing step, the verification step, and the second erasing step.

By the above-described driving method, as seen from FIG. 13, if writing of the second writing step fails, the recovery writing step and the recovery erasing step are executed to cause desired variation of the resistance state in following the second writing steps and the second erasing steps.

It should be noted that it has been described as an example in the above description that a verification step is provided to verify writing in the second writing step (in other words, verify whether or not the variable resistance layer is in the low resistance state). However, it is also possible to provide a different verification step for verifying writing in the second erasing step (in other words, verify whether or not the variable resistance layer is in the high resistance state).

In this case, if the verification step after the second erasing step detects that the variable resistance layer is not in the high resistance state, then the recovery erasing step is first executed and then the recovery writing step is executed.

Third Embodiment

The third embodiment according to the present invention is a nonvolatile storage device that includes the variable resistance elements described in the first embodiment. The following describes a structure and operations of the nonvolatile storage device.

[Structure of Nonvolatile Storage Device]

Figure 15:
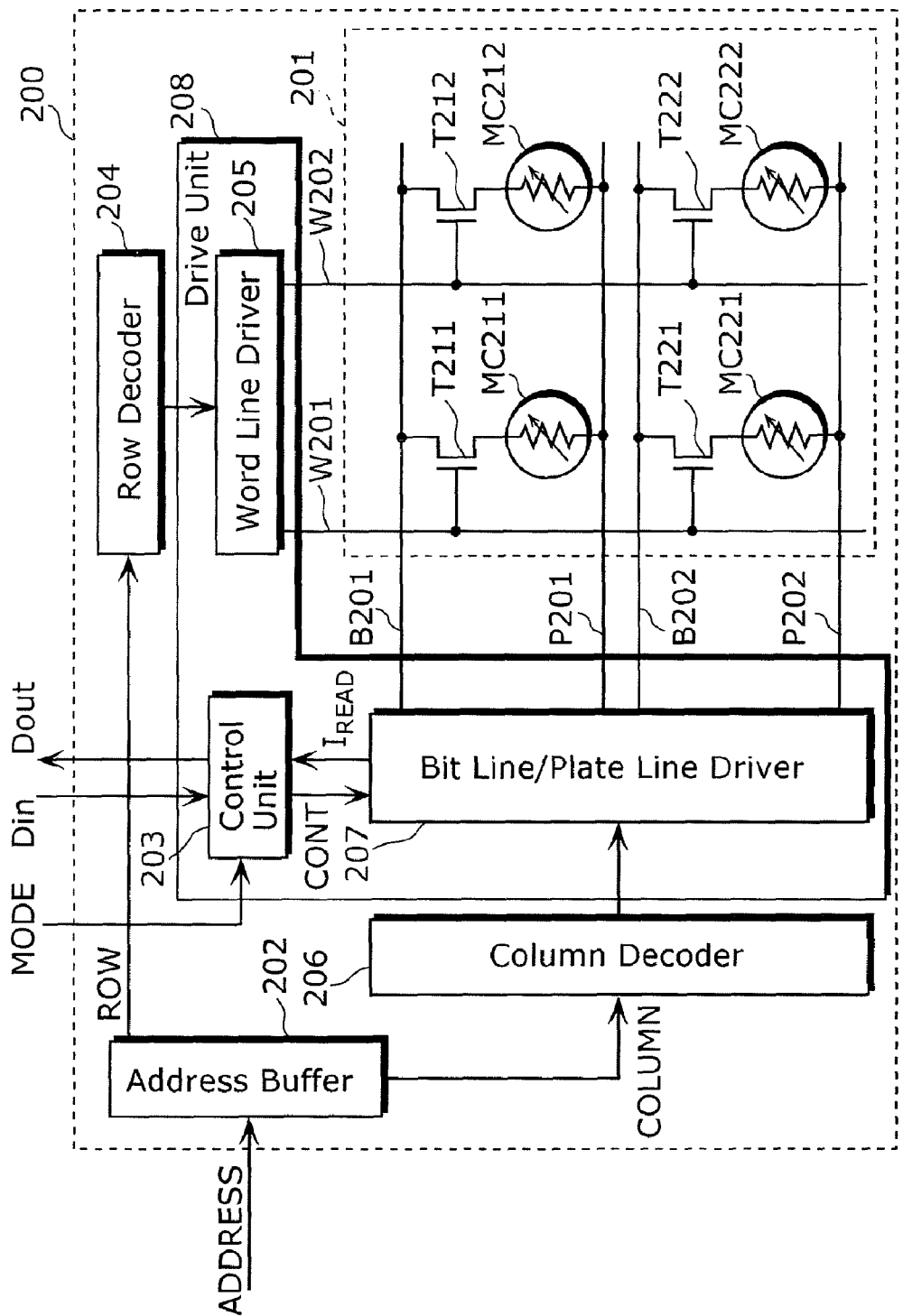
FIG. 15 is a block diagram showing an example of a structure of a nonvolatile storage device according to a third embodiment of the present invention.

FIG. 15 is a block diagram showing an example of the structure of the nonvolatile storage device according to the third embodiment of the present invention. As shown in FIG. 15, the nonvolatile storage device 200 includes a memory array 201, an address buffer 202, a control unit 203, a row decoder 204, a word line driver 205, a column decoder 206, and a bit line/plate line driver 207. The memory array 201 includes the variable resistance elements. Here, a set of the control unit 203, the word line driver 205, and the bit line/plate line driver 207 is called a drive unit 208.

As shown in FIG. 15, the memory array 201 includes: two word lines W201 and W202; two bit lines B201 and B202; two plate lines P201 and P202; four transistors T211, T212, T221, and T222; and memory cells MC211, MC212, MC221, and MC222. The word lines W201 and W202 are arranged in a vertical direction. The bit lines B201 and B202 are arranged in a horizontal direction and cross the word lines W201 and W202. The plate lines P201 and P202 are arranged in a horizontal direction and correspond to the bit lines B201 and B202, respectively. The transistors T211, T212, T221, and T222 are arranged in a matrix and each of the transistors corresponds to a corresponding one of intersections of the word lines W201 and W202 and the bit lines B201 and B202. The memory cells MC211, MC212, MC221, and MC222 are arranged in a matrix and each of the memory cells corresponds to a corresponding one of the transistors T211, T212, T221, and T222.

The number of each of the above-described structure elements is not limited to the above. For instance, although it has been described as an example that the memory array 201 has four memory cells, the memory array 201 may have five or more memory cells.

Each of the above-described memory cells MC211, MC212, MC221, and MC222 is the variable resistance element described in the first embodiment with reference to FIG. 4. With reference also to FIG. 4, a structure of the memory array 201 is described in detail below. The transistor T211 and the memory cell MC211 are provided between the bit line B201 and the plate line P201. Here, a source of the transistor T211 and the first terminal 11 of the memory cell MC211 are arranged in series to be connected to each other. The structure is explained in more detail below. The transistor T211 is arranged between the bit line B201 and the memory cell MC211 and connected to the bit line B201 and the memory cell MC211. The memory cell MC211 is arranged between the transistor T211 and the plate line P201 and connected to the transistor T211 and the plate line P201. A gate of the transistor T211 is connected to the word line W201.

The other three transistors T212, T221, and T22 are arranged in series with the other three memory cells MC212, MC221, and MC222, respectively, and they are connected in the same manner as described for the transistor T211 and the memory cell MC211. Therefore, the connection structure is not explained again.

With the above structure, when gates of the transistors T211, T212, T221, and T22 are applied with a predetermined voltage (activation voltage) via the word lines W201 and W202, drains and sources of the transistors T211, T212, T221, and T22 are conducted.

The address buffer 202 receives address signals ADDRESS from an external circuit (not shown), and then, based on the received address signals ADDRESS, provides row address signals ROW to the row decoder 204 and column address signals OLUMN to the column decoder 206. The address signals ADDRESS are signals indicating an address of a memory cell selected from the memory cells MC211, MC212, MC221, and MC222. The row address signals ROW are signals indicating an address of a row of the address indicated in the address signals ADDRESS. The column address signals COLUMN are signals indicating an address of a column of the address indicated in the address signals ADDRESS.

The control unit 203 selects at least one of a write mode, a reset mode, and a read mode, based on a mode selection signal MODE received from an external circuit.

In the write mode, the control unit 203 issues a control signal CONT instructing to "apply a writing voltage", to the bit line/plate line driver 207, based on input data Din received from an external circuit.

In the case of the read mode, the control unit 203 issues a control signal CONT instructing to "apply a read voltage", to the bit line/plate line driver 207. In the read mode, the control unit 203 further receives a signal $I_{READ}$ from the bit line/plate line driver 207, and provides the external circuit with output data Dout indicating a bit value corresponding to the signal $I_{READ}$. The signal $I_{READ}$ is a signal indicating a current value of current flowing in the plate lines P201 and P202 in the read mode.

In the reset mode, the control unit 203 detects a memory state of each of the memory cells MC211, MC212, MC221, and MC222, and based on the memory state, issues the control signal CONT instructing to "apply a reset voltage", to the bit line/plate line driver 207.

The row decoder 204 receives the row address signals ROW from the address buffer 202, and based on the row address signals ROW, selects one of the two word lines W201 and W202. Based on the output signal of the row decoder 204, the word line driver 205 applies an activation voltage to the word line selected by the row decoder 204.

The column decoder 206 receives the column address signals COLUMN from the address buffer 202, and based on the column address signals COLUMN, selects one of the two bit lines B201 and B202 and also selects one of the two plate lines P201 and P202.

When the bit line/plate line driver 207 receives the control signal CONT instructing to "apply the writing voltage" from the control unit 203, the bit line/plate line driver 207 applies the writing voltage $V_{WRITE}$ to the bit line selected by the column decoder 206 and sets the plate line selected by the column decoder 206 to be grounded, based on the output signal of the column decoder 206.

When the bit line/plate line driver 207 receives the control signal CONT instructing to "apply the read voltage" from the control unit 203, the bit line/plate line driver 207 applies the read voltage $V_{READ}$ to the bit line selected by the column decoder 206 and sets the plate line selected by the column decoder 206 to be grounded, based on the output signal of the column decoder 206. Then, the bit line/plate line driver 207 provides the control unit 203 with a signal $I_{READ}$ indicating the current value of current flowing in the selected plate line.

When the bit line/plate line driver 207 receives the control signal CONT instructing to "apply the reset voltage" from the control unit 203, the bit line/plate line driver 207 applies the reset voltage $V_{RESET}$ to the bit line selected by the column decoder 206 and sets the plate line selected by the column decoder 206 to be grounded, based on the output signal of the column decoder 206.

Here, the voltage value of the writing voltage $V_{WRITE}$ is set to −3.5 V for a first writing step and −2.5 V for a second writing step, and a pulse width of the writing voltage $V_{WRITE}$ is set to 100 ns, for example. Further, the voltage value of the read voltage $V_{READ}$ is set to +0.5V, for example. Furthermore, the voltage value of the reset voltage $V_{RESET}$ is set to +4.0 V for a first erasing step and +2.5 V for a second erasing step, and a pulse width of the reset voltage $V_{RESET}$ is set to 100 ns, for example.

Such various voltage pulses having different voltage values are generated by using a voltage generation circuit (not shown) that can generate various kinds of voltages. An example of methods for determining the voltage value of the voltage pulse to be generated is described in detail in the following operation example.

[Operations of Nonvolatile Storage Device]

The operation example of the nonvolatile storage device 200 having the above-described structure is described for each of: the write mode (mode for writing input data Din to a memory cell); the reset mode (mode for resetting the data written in a memory cell); and the read mode (mode for outputting the data written in a memory cell from the memory as output data Dout). Here, the first writing step and the second writing step correspond to the write modes, and the first erasing step and the second erasing step correspond to the reset modes.

For convenience in the explanation, it is assumed that the mode selection signal MODE includes information designating whether the write mode corresponds to the first writing step or the second writing step, and designating whether the reset mode corresponds to the first erasing step or the second erasing step. Via the mode selection signal MODE, an external circuit instructs the control unit 203 of which of the first writing step, the second writing step, the first erasing step, and the second erasing step is to be executed.

It is also assumed that the address signals ADDRESS are the signal indicating an address of the memory cell MC211.

[Write Mode]

The control unit 203 receives input data Din from an external circuit. Here, if the input data Din is "1", then the control unit 203 issues the control signal CONT instructing to "apply the writing voltage" to the bit line/plate line driver 207. On the other hand, if the input data Din is "0", then the control unit 203 does not issues the control signal CONT.

The control signal CONT instructing to "apply the writing voltage" includes information indicating which of the first writing voltage pulse and the second wring voltage pulse is to be applied to a target memory cell according to the designation of the mode selection signal MODE.

When the bit line/plate line driver 207 receives the control signal CONT instructing to "apply the writing voltage" from the control unit 203, the bit line/plate line driver 207 applies the writing voltage $V_{WRITE}$ to the bit line B201 selected by the column decoder 206. In addition, the bit line/plate line driver 207 sets the plate line P201 selected by the column decoder 206, to be grounded.

Here, the word line W201 selected by the row decoder 204 is applied with an activation voltage by the word line driver 205. Therefore, the drain and the source of the transistor T211 are conducted.

Thereby, in the first writing step, the first writing voltage pulse having a voltage value of −3.5 V and a pulse width of 100 ns is applied to the memory cell MC211 as the writing voltage $V_{WRITE}$. Then, in the second writing step, the second writing voltage pulse having a voltage value of −2.5 V and a pulse width of 100 ns is applied to the memory cell MC211 as the writing voltage $V_{WRITE}$. Thereby, the state of the memory cell MC211 is changed from the high resistance state to the low resistance state. On the other hand, no writing voltage pulse is applied to the memory cells M221 and MC222, and no activation voltage is applied to the gate of the transistor T212 connected in series with the memory cell MC212. As a result, the resistance states of the memory cells MC212, MC221, and MC222 are not changed.

In the above manner, only the memory cell MC211 can be changed to the low resistance state, which allows one bit data indicating "1" corresponding to the low resistance state to be written in the memory cell MC211.

When the writing to the memory cell MC211 has been completed, new address signals ADDRESS are provided to the address buffer 202, and the above-described operation of the write mode of the nonvolatile storage device is repeated for the other memory cells except the memory cell MC211.

[Read Mode]

The control unit 203 issues a control signal CONT instructing to "apply the read voltage" to the bit line/plate line driver 207.

When the bit line/plate line driver 207 receives the control signal CONT instructing to "apply the read voltage" from the control unit 203, the bit line/plate line driver 207 applies the read voltage $V_{READ}$ to the bit line B201 selected by the column decoder 206. In addition, the bit line/plate line driver 207 sets the plate line P201 selected by the column decoder 206 to be grounded.

Here, the word line W201 selected by the row decoder 204 is applied with an activation voltage by the word line driver 205. Therefore, the drain and the source of the transistor T211 are conducted.

Thereby, as the read voltage $V_{READ}$, a measuring voltage of +0.5 V is applied to the memory cell MC211. As a result, current having a current value depending on the resistance value of the memory cell MC211 flows into the plate line P201 via the memory cell MC212.

Here, no measured voltage is applied to the memory cells MC221 and MC222, and no activation voltage is applied to the gate of the transistor T212 connected in series with the memory MC212. Therefore, the above current does not flow in the memory cells MC212, MC221, and MC222.

Next, the bit line/plate line driver 207 measures a current value of current flowing in the plate line P201, and provides the control unit 203 with the signal $I_{READ}$ indicating a value of the measurement.

The control unit 203 provide the outside with output data Dout depending on a current value indicated by the signal $I_{READ}$. For example, if the current value indicated by the signal $I_{READ}$ is a current value of current flowing at the time when the memory cell MC211 is in the low resistance state, then the control unit 203 outputs output data Dout indicating "1".

Thereby, current depending on the resistance value of the memory cell MC211 flows only to the memory cell MC211 and then to the plate line P201. As a result, one bit data indicating "1" is read out from the memory cell MC211 (in other words, one bit data is read out).

When the readout from the memory cell MC211 has been completed, new address signals ADDRESS are provided to the address buffer 202, and the above-described operation of the read mode of the nonvolatile storage device is repeated for the other memory cells except the memory cell MC211.

[Reset Mode]

In the reset mode, first, the control unit 203 executes the above-described read mode to obtain information of a state of a resistance value (here, memory state) of the memory cell MC211. Then, if it is determined that one bit data indicating "1" is stored in the memory cell MC211 (in other words, if it is determined that the memory cell MC211 is in the low resistance state), then the control unit 203 issues the control signal CONT instructing to "apply the reset voltage" to the bit line/plate line driver 207. On the other hand, if it is determined that one bit data indicating "0" is stored in the memory cell MC211 (in other words, if it is determined that the memory cell MC211 is in the high resistance state), then the control unit 203 does not issues the above control signal CONT.

The control signal CONT instructing to "apply the reset voltage" includes information indicating which of the first erasing voltage pulse and the erasing wring voltage pulse is to be applied to a target memory cell according to the designation of the mode selection signal MODE.

When the bit line/plate line driver 207 receives the control signal CONT instructing to "apply the reset voltage" from the control unit 203, the bit line/plate line driver 207 applies the reset voltage $V_{RESET}$ to the bit line 8201 selected by the column decoder 206. In addition, the bit line/plate line driver 207 sets the plate line P201 selected by the column decoder 206, to be grounded.

Here, the word line W201 selected by the row decoder 204 is applied with an activation voltage by the word line driver 205. Therefore, the drain and the source of the transistor T211 are conducted.

Therefore, in the first erasing step, the first erasing voltage pulse having a voltage value of +4.0 V and a pulse width of 100 ns is applied to the memory cell MC211 as the reset voltage $V_{RESET}$. Then, in the second erasing step, the second erasing voltage pulse having a voltage value of +2.5 V and a pulse width of 100 ns is applied to the memory cell MC211 as the reset voltage $V_{RESET}$. Thereby, the state of the memory cell MC211 is changed from the low resistance state to the high resistance state. On the other hand, no erasing voltage pulse is applied to the memory cells M221 and MC222, and no activation voltage is applied to the gate of the transistor T212 connected in series with the memory cell MC212. As a result, the resistance states of the memory cells MC212, MC221, and MC222 are not changed.

In the above manner, only the memory cell MC211 can be changed to the high resistance state, which allows one bit data indicating "1" corresponding to the low resistance state to be reset to "0" corresponding to the high resistance state.

When the resetting of the memory cell MC211 has been completed, new address signals ADDRESS are provided to the address buffer 202, and the above-described operation of the reset mode of the nonvolatile storage device is repeated for the other memory cells except the memory cell MC211.

As described above, the nonvolatile storage device 200 sets in the program mode, an absolute value of the voltage value of the first writing voltage pulse to be greater than an absolute value of the voltage value of the second writing voltage pulse, and sets, in the reset mode, an absolute value of the voltage value of the first erasing voltage pulse to be greater than an absolute value of the voltage value of the second erasing voltage pulse. Thereby, stable high-speed operation and good endurance characteristics can be achieved.

It is also possible as a different structure that the nonvolatile storage device automatically executes the first writing step and the first erasing step as initialization for all memory cells.

In such a nonvolatile storage device, the control unit further includes: a flag register that indicates whether the initialization has been completed; and an address counter that can designate all memory cells sequentially, for example.

The control unit executes the first writing step and the first erasing step for each of the memory cells sequentially designated by the address counter, and then updates a value in the flag register to indicate the completion of the initialization. Then, according to access from an external circuit, the control unit executes the second writing step and the second erasing step.

Fourth Embodiment

The fourth embodiment of the present invention is a cross-point type nonvolatile storage device having the variable resistance elements described in the first embodiment. Here, the cross-point type nonvolatile storage device is a storage device in which an active layer is provided at an intersection (three-dimensional intersection) of a word line and a bit line.

The following describes a structure and operations of the nonvolatile storage device according to the fourth embodiment.

[Structure of Nonvolatile Storage Device]

Figure 16:
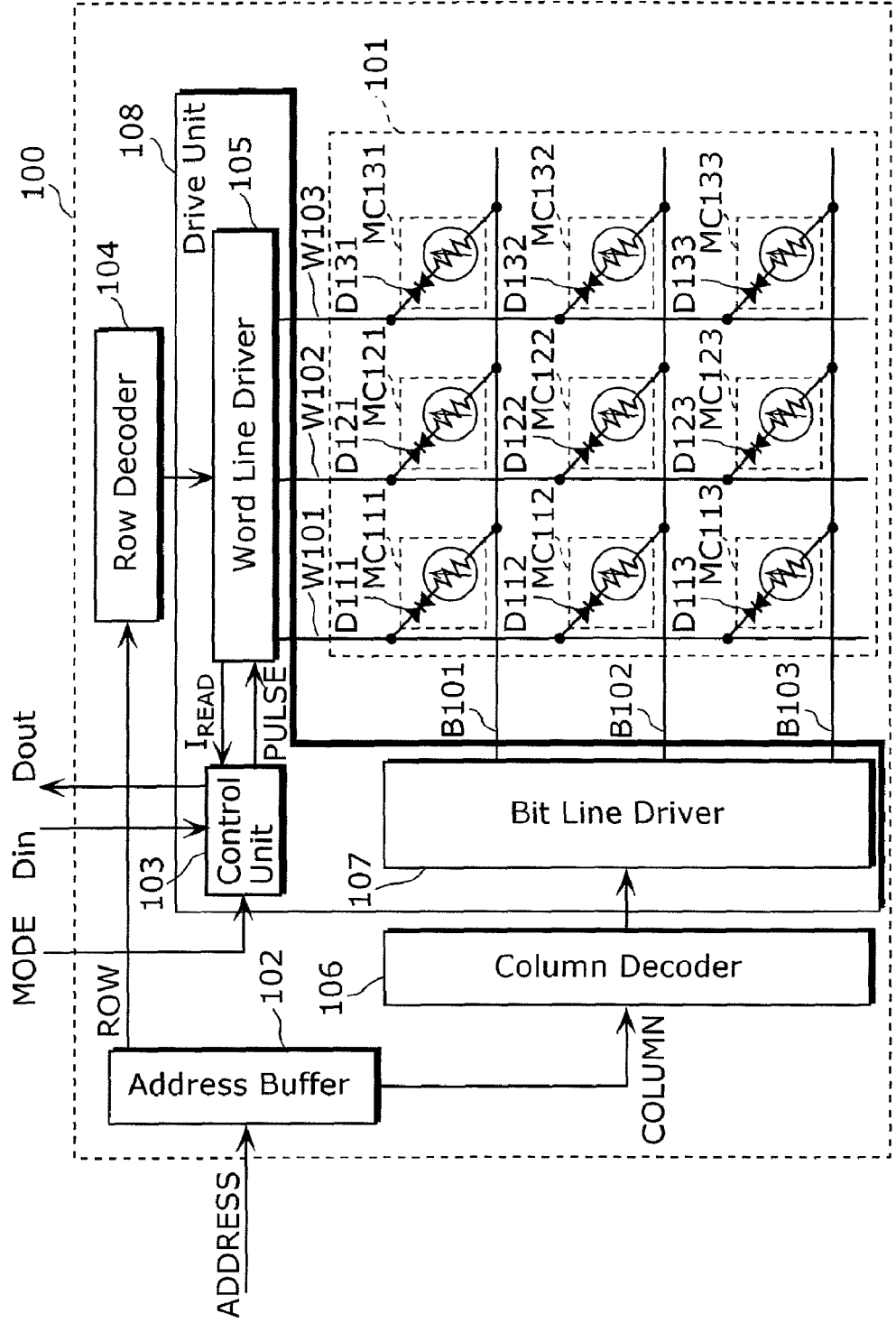
FIG. 16 is a block diagram showing an example of a structure of a nonvolatile storage device according to a fourth embodiment of the present invention.

FIG. 16 is a block diagram showing an example of a structure of the nonvolatile storage device according to the fourth embodiment of the present invention. As shown in FIG. 16, the cross-point type nonvolatile storage device 100 includes a memory array 101, an address buffer 102, a control unit 103, a row decoder 104, a word line driver 105, a column decoder 106, and a bit line/plate line driver 107. The memory array 101 includes the variable resistance elements. Here, a set of the control unit 103, the word line driver 105, and the bit line/plate line driver 107 is called a drive unit 108.

As shown in FIG. 16, the memory array 101 includes a plurality of word lines W101, W102, W103, . . . and a plurality of bit lines B101, 8102, B103, . . . . The word lines W101, W102, W103, . . . are arranged in parallel in a vertical direction. The bit lines B101, B102, B103, . . . are arranged in parallel in a horizontal direction and cross the word lines W101, W102, W103, . . . . Furthermore, the word lines W101, W102, W103, . . . are arranged on a first plane in parallel to a main plane of a substrate (not shown), and the bit lines B101, B102, B103, . . . are arranged on a second plane that is above the first plane and in substantially parallel to the first plane. Therefore, the word lines W101, W102, W103, . . . cross the bit lines B101, B102, B103, . . . three-dimensionally. At the three-dimensional intersections, there are provided a plurality of memory cells MC111, MC112, MC113, MC121, MC122, MC123, MC131, MC132, MC133, . . . (hereinafter, referred to as "memory cells MC111, MC112, . . . ").

In each of the memory cells MC, a variable resistance element is connected in series with a corresponding one of the current steering elements D111, D112, D113, D121, D122, D123, D131, D132, D133 each of which is implemented as a bidirectional diode. In addition, each of the variable resistance elements is also connected to a corresponding one of the bit lines 8101, B102, B103, . . . . Moreover, each of the current steering elements is connected to (a) a corresponding variable resistance element and (b) a corresponding one of the word lines W101, W102, W103, . . . . The variable resistance element may be the variable resistance element 10 according to the first embodiment.

The address buffer 102 receives address signals ADDRESS from an external circuit (not shown), and then, based on the received address signals ADDRESS, provides row address signals ROW to the row decoder 104 and column address signals COLUMN to the column decoder 106. The address signals ADDRESS are signals indicating an address of a memory cell selected from the memory cells MC112, MC121, . . . . The row address signals ROW are signals indicating an address of a row of the address indicated in the address signals ADDRESS. The column address signals COLUMN are signals indicating an address of a column of the address indicated in the address signals ADDRESS.

The control unit 103 selects one of a program mode (corresponding to the first and second writing steps and the first and second erasing steps) and an read mode, based on a mode selection signal MODE received from an external circuit.

In the program mode, the control unit 103 applies a write voltage pulse or an erasing voltage pulse to the word line driver 105, based on input data Din received from an external circuit.

Then, in the read mode, the control unit 103 applies a readout voltage to the word line driver 105. In the read mode, the control unit 103 further receives a signal $I_{READ}$ from the word line driver 105, and provides the external circuit with output data Dout indicating a bit value depending on the signal $I_{READ}$. The signal $I_{READ}$ is a signal indicating a current value of current flowing in the word lines W101, W102, W103, . . . during the read mode.

The row decoder 104 receives the row address signals ROW from the address buffer 102, and based on the row address signals ROW, selects one of the word lines W101, W102, W103, . . . . Based on the output signal of the row decoder 104, the word line driver 105 applies an activation voltage to the word line selected by the row decoder 104.

The column decoder 106 receives the column address signals COLUMN from the address buffer 102, and selects one of the bit lines B101, B102, B103, . . . based on the column address signals COLUMN.

The bit line driver 107 sets the bit line selected by the column decoder 106, to be grounded, based on the output signal of the column decoder 106.

It should be noted that the fourth embodiment provides a cross-point type storage device that is made of a single layer, but the cross-point type storage device may be made of multiple layers by stacking memory arrays.

It should also be noted that a positional relationship may be exchanged between the variable resistance element and the current steering element. More specifically, it is also possible that the word lines are connected to the variable resistance elements and the bit lines are connected to the current steering elements.

It is also possible that one or both of a bit line and a word line supplies power to a variable resistance element. In more detail, it is possible that one of a bit line and a word line is grounded and the other line that is not grounded applies a power voltage to the variable resistance element. Or, it is also possible that both of a bit line and a word line are applied with different power voltages other than a ground voltage, and power is supplied to the variable resistance element based on a predetermined voltage difference between the bit line and the word line.

[Operations of Nonvolatile Storage Device]

The operation example of the nonvolatile storage device 100 having the above-described structure is described for each of the program mode and the read mode. Here, since known methods can be used for selecting a bit line or a word line and for applying a voltage pulse, the methods are not described in detail below.

For convenience in the explanation, it is assumed that a mode selection signal MODE includes information designating whether the program mode corresponds to the first writing step, the second writing step, the first erasing step, or the second erasing step. Using the mode selection signal MODE, An external circuit instructs the control unit 103 which of the first writing step, the second writing step, the first erasing step, and the second erasing step is to be executed.

In the following, it is assumed that programming and reading are executed for the memory cell MC122.

[Program Mode]

When one bit data indicating "1" is to be programed (written) in the memory cell MC122, the bit line driver 107 sets the bit line B102 to be grounded and the word line driver 105 electrically connects the word line W102 to the control unit 103. Then, the control unit 103 performs control to apply a writing voltage pulse to the word line W102. Here, a voltage value of the writing voltage pulse is set to be −3.5 V in the first writing step and −2.5 V in the second writing step, respectively, according to the designation of the mode selection signal MODE. In addition, a pulse width is set to be 100 ns in both steps.

The above-described operation allows the writing voltage pulse to be applied to the variable resistance element in the memory cell MC122. As a result, the state of the variable resistance element in the memory cell MC122 is changed to the low resistance state corresponding to "1".

On the other hand, when one bit data indicating "0" is to be programmed (erased) in the memory cell MC122, the bit line driver 107 sets the bit line B102 to be grounded and the word line driver 105 electrically connects the word line W102 to the control unit 103.

Then, the control unit 103 performs control to apply an erasing voltage pulse to the word line W102. Here, a voltage value of the erasing voltage pulse is set to be +4.0 V in the first erasing step and +2.5 V in the second writing step, respectively, according to the designation of the mode selection signal MODE. In addition, a pulse width is set to be 100 ns in both steps.

The above-described operation allows a erasing voltage pulse to be applied to the variable resistance element in the memory cell MC122. As a result, the state of the variable resistance layer in the memory cell MC122 is changed to the high resistance state corresponding to "0".

[Read Mode]

When data is to be read out from the memory cell MC122, the bit line driver 107 sets the bit line B102 to be grounded and the word line driver 105 electrically connects the word line W102 to the control unit 103. Then, the control unit 103 performs control to apply a readout voltage to the word line W102. Here, a voltage value of the readout voltage is set to be +0.5 V.

When the readout voltage is applied to the memory cell MC122, current having a current value depending on a resistance value of the variable resistance layer in the memory cell MC122 flows between the bit line B102 and the word line W102. The control unit 103 detects the current value of the current, and detects the resistance state of the memory cell MC122 based on the current value and the readout voltage.

If the variable resistance layer in the memory cell MC122 is in the low resistance state, then it is determined that the data written in the memory cell MC122 is "1". On the other hand, if the variable resistance layer in the memory cell MC122 is in the high resistance state, then it is determined that the data written in the memory cell MC122 is "0".

As described above, in the program mode, the nonvolatile storage device 100 sets an absolute value of a voltage value of the first writing voltage pulse to be greater than an absolute value of a voltage value of the second writing voltage pulse, and sets an absolute value of a voltage value of the first erasing voltage pulse to be greater than an absolute value of a voltage value of the second erasing voltage pulse. Thereby, stable high-speed operation and good endurance characteristics can be achieved.

Likewise the nonvolatile storage device according to the previous embodiment, the nonvolatile storage device according to the fourth embodiment may automatically execute the first writing step and the first erasing step as initialization for all memory cells.

Other Embodiments

It should be noted that it has been described in each of the above embodiments that the variable resistance layer is made of stacked tantalum oxide layers, but the present invention is not limited to the above. For example, the variable resistance layer may be made of stacked hafnium (Hf) oxide layers, or stacked zirconium (Zr) oxide layers.

When the variable resistance layer is made of stacked hafnium oxide layers, the following is preferable. Assuming that a composition of a first hafnium oxide layer is expressed as $HfO_x$ and a composition of a second hafnium oxide layer is expressed as $HfO_y$, x is within a range approximately from 0.9 to 1.6, y is within a range approximately from 1.89 to 1.97, and the first and second hafnium oxide layers are oxygen-deficient compositions in comparison with stoichiometric compositions.

When the variable resistance layer is made of stacked zirconium oxide layers, the following is preferable. Assuming that a composition of a first zirconium oxide layer is expressed as $ZrO_x$ and a composition of a second zirconium oxide layer is expressed as $ZrO_y$, x is within a range approximately from 0.9 to 1.4, y is within a range approximately from 1.8 to 2, and the first and second zirconium oxide layers are oxygen-deficient compositions in comparison with stoichiometric compositions.

The above-described oxygen-deficient hafnium oxides and oxygen-deficient zirconium oxides can be generated in the same method as that for the above-described oxygen-deficient tantalum oxides described in the above embodiments.

It should be noted that a composition of a transition metal oxide can be analyzed by using Auger Electron Spectroscopy (AES), X-ray Photoelectron Spectroscopy (XPS), Rutherford Backscattering Spectrometry (RBS), and the like, and the best method for analyzing absolute values of compositions most precisely is the RBS. Regarding the above-described hafnium oxide and zirconium oxide, the RBS is used for the composition analysis for each of the transition metal oxides.

INDUSTRIAL APPLICABILITY

The variable resistance element driving method and the nonvolatile storage device according to the present invention are useful as variable resistance element driving methods and storage devices, respectively, which are utilized in various electronic devices such as personal computers and mobile telephones.

NUMERICAL REFERENCES 1 substrate
2 lower electrode
3 variable resistance layer
3a first tantalum oxide layer
3b second tantalum oxide layer
4 upper electrode
5 power source
10 variable resistance element
11 first terminal
12 second terminal
100 nonvolatile storage device
101 memory array
102 address buffer
103 control unit
104 row decoder
105 word line driver
106 column decoder
107 bit line driver
108 drive unit
W101, W102, W103 word lines
B101, B102, B103 bit lines
MC111, MC112, MC113, MC121, MC122, MC123, MC131, MC132, MC133 memory cells D111, D112, D113, D121, D122, D123, D131, D132, D133 current-limiting elements
200 nonvolatile storage
201 memory array
202 address buffer
203 control unit
204 row decoder
205 word line driver
206 column decoder
207 bit line/plate line driver
208 drive unit
W210, W202 word lines
B201, B202 bit lines
P201, P202 plate lines
MC211, MC212, MC221, MC222 memory cells
T211, T212, T221, T222 transistors

The invention claimed is:

1. A method of driving a variable resistance element that includes a metal oxide having a resistance value increased and decreased depending on application of electric pulses, the metal oxide comprising a first oxide layer and a second oxide layer which are stacked, the second oxide layer having an oxygen content percentage higher than an oxygen content percentage of the first oxide layer, said method comprising:

performing a plurality of writing steps by applying a writing voltage pulse having a first polarity to the metal oxide, so as to change a resistance state of the metal oxide from high to low; and performing a plurality of erasing steps by applying an erasing voltage pulse having a second polarity to the metal oxide, so as to change the resistance state of the metal oxide from low to high, the second polarity being different from the first polarity, wherein |Vw1|>|Vw2| is satisfied, where Vw1 represents a voltage value of the writing voltage pulse for first to N-th writing steps among the plurality of writing steps, where N is equal to or more than 1, and Vw2 represents a voltage value of the writing voltage pulse for (N+1)-th and subsequent writing steps among the plurality of writing steps,

|Ve1|>|Ve2| is satisfied, where Ve1 represents a voltage value of the erasing voltage pulse for first to M-th erasing steps among the plurality of erasing steps, where M is equal to or more than 1, and Ve2 represents a voltage value of the erasing voltage pulse for (M+1)-th and subsequent erasing steps among the plurality of erasing steps, and the (N+1)-th writing step follows the M-th erasing step.

2. The method according to claim 1,
wherein |Ve1|≧|Vw1| and |Ve2|≧|Vw2| are further satisfied.

3. The method according to claim 1, further comprising:
performing a recovery writing step by applying a recovery writing voltage pulse having a voltage value of Vw3, where |Vw3|>|Vw2|, to the metal oxide, so as to change the resistance state of the metal oxide from high to low, when any one of the (N+1)-th and subsequent writing steps fails to change the resistance state of the metal oxide from high to low; and performing a recovery erasing step by applying a recovery erasing voltage pulse having a voltage value of Ve3, where |Ve3|>|Ve2|, to the metal oxide, so as to change the resistance state of the metal oxide from low to high, when any one of the (M+1)-th and subsequence erasing steps fails to change the resistance state of the metal oxide from low to high.

4. The method according to claim 3,
wherein the voltage value of Vw1 is equal to the voltage value of Vw3, and the voltage value of Ve1 is equal to the voltage value of Ve3.

5. The method according to claim 1,
wherein the first oxide layer comprises a tantalum oxide having a composition represented by $TaO_x$, where $0.8 \leq x \leq 1.9$, and
the second oxide layer comprises a tantalum oxide having a composition represented by $TaO_y$, where $2.1 \leq y < 2.5$.

6. A nonvolatile storage device comprising:
a first electrode;
a second electrode;
a variable resistance element which is provided between said first electrode and said second electrode and which includes a metal oxide having a resistance value increased and decreased depending on application of an electric pulse between said first electrode and said second electrode; and
a drive unit,
wherein said metal oxide comprises a first oxide layer and a second oxide layer which are stacked, said second oxide layer having an oxygen content percentage higher than an oxygen content percentage of said first oxide layer, and
said drive unit is configured to perform:
a writing step by applying a writing voltage pulse having a first polarity between said first electrode and said second electrode, so as to change a resistance state of said metal oxide from high to low; and
an erasing step by applying an erasing voltage pulse having a second polarity between said first electrode and said second electrode, so as to change the resistance state of said metal oxide from low to high, the second polarity being different from the first polarity,
wherein |Vw1|>|Vw2| is satisfied, where Vw1 represents a voltage value of the writing voltage pulse for first to N-th writing steps, where N is equal to or more than 1, and Vw2 represents a voltage value of the writing voltage pulse for (N+1)-th and subsequent writing steps,
|Ve1|>|Ve2| is satisfied, where Ve1 represents a voltage value of the erasing voltage pulse for first and M-th erasing steps, where M is equal to or more than 1, and Ve2 represents a voltage value of the erasing voltage pulse for (M+1)-th and subsequent erasing steps, and
the (N+1)-th writing step follows the M-th erasing step.

7. The nonvolatile storage device according to claim 6,
wherein |Ve1|≧|Vw1| and |Ve2|≧|Vw2| are further satisfied.

8. The nonvolatile storage device according to claim 6,
wherein said drive unit is configured to further perform:
a recovery writing step by applying a recovery writing voltage pulse having a voltage value of Vw3, where |Vw3|>|Vw2|, between said first electrode and said second electrode, so as to change the resistance state of said metal oxide from high to low, when any one of the (N+1)-th and subsequence writing steps fails to change the resistance state of said metal oxide from high to low; and a recovery erasing step by applying a recovery erasing voltage pulse having a voltage value of Ve3, where |Ve3|>|Ve2|, between said first electrode and said second electrode, so as to change the resistance state of said metal oxide from low to high, when any one of the (M+1)-th and subsequent erasing step fails to change the resistance state of said metal oxide from low to high.

9. The nonvolatile storage device according to claim 8, where the voltage value of Vw1 is equal to the voltage value of Vw3, and the voltage value of Ve1 is equal to the voltage value of Ve3.

10. The nonvolatile storage device according to claim 6, wherein said first oxide layer comprises a tantalum oxide having a composition represented by $TaO_x$, where $0.8 \leq x \leq 1.9$, and said second oxide layer comprises a tantalum oxide having a composition represented by $TaO_y$, where $2.1 \leq y < 2.5$.

11. The nonvolatile storage device according to claim 6, further comprising a current steering element electrically connected to one of said first electrode and said second electrode.

12. The nonvolatile storage device according to claim 11, wherein said current steering element is a selection transistor.

13. The nonvolatile storage device according to claim 11, wherein said current steering element is a diode.

14. An initialization method of performing initialization for a variable resistance element which includes a metal oxide having a resistance value increased and decreased depending on application of electric pulses, the metal oxide including a first oxide layer and a second oxide layer which are stacked, the second oxide layer having an oxygen content percentage higher than an oxygen content percentage of the first oxide layer, to and from the variable resistance element, data being written and erase by performing one or more times a set of a writing step and an erasing step so as to perform at least one writing step and at least one erasing steps, the writing step being performed by applying a writing voltage pulse having a first polarity and a voltage value of Vw2 to the metal oxide, so as to change a resistance state of the metal oxide from high to low, and the erasing step being performed by applying an erasing voltage pulse having a second polarity and a voltage value of Ve2 to the metal oxide, so as to change the resistance state of the metal oxide from low to high, the second polarity being different from the first polarity, and the erasing step following the writing step, said method comprising:

at least one initial writing step by applying a voltage pulse having the first polarity and a voltage value of Vw1, where |Vw1|>|Vw2|, to the metal oxide, so as to change the resistance state of the metal oxide from high to low; and at least one initial erasing step by applying a voltage pulse having the second polarity and a voltage value of Ve1, where |Ve1|>|Ve2|, to the metal oxide, so as to change the resistance state of the metal oxide from low to high, wherein a first one of the at least one writing step is performed next to a last one of the at least one initial erasing step.

* * * * *